(12) United States Patent
Al-Absi

(10) Patent No.: US 12,463,461 B2
(45) Date of Patent: Nov. 4, 2025

(54) RF-DC CONVERTER FOR ENERGY HARVESTING USING CMOS N-WELL PROCESS

(71) Applicant: KING FAHD UNIVERSITY OF PETROLEUM AND MINERALS, Dhahran (SA)

(72) Inventor: Muneer A. Al-Absi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 73 days.

(21) Appl. No.: 18/410,053

(22) Filed: Jan. 11, 2024

(65) Prior Publication Data

US 2025/0233452 A1    Jul. 17, 2025

(51) Int. Cl.
  *H02J 50/00*    (2016.01)
  *H03K 17/06*    (2006.01)
  (Continued)

(52) U.S. Cl.
  CPC .......... *H02J 50/001* (2020.01); *H03K 17/063* (2013.01); *H03K 17/102* (2013.01); *H03K 17/6871* (2013.01)

(58) Field of Classification Search
  CPC ... H02J 50/001; H03K 17/063; H03K 17/102; H03K 17/6871; H03K 17/06;
  (Continued)

(56) References Cited

U.S. PATENT DOCUMENTS

| 6,111,780 A | * | 8/2000 | Bertin | ................... H10B 10/12 257/E27.099 |
| 2018/0069486 A1 | | 3/2018 | Ouda et al. | |

(Continued)

FOREIGN PATENT DOCUMENTS

CN    108306425 A    7/2018

OTHER PUBLICATIONS

Liang et al.; Modelling and optimisation of high-efficiency differential-drive complementary metal-oxide-semiconductor rectifier for ultra-high-frequency radio-frequency energy harvesters; IET Power Electronics, 2019, vol. 12 Iss. 3; Jan. 25, 2019; 10 Pages.

(Continued)

*Primary Examiner* — Jung Kim
(74) *Attorney, Agent, or Firm* — Oblon, McClelland, Maier & Neustadt, L.L.P.

(57) ABSTRACT

A radio frequency to direct current (RF-DC) converter for energy harvesting includes a first cross-coupled circuit and a second cross-coupled circuit. The first cross-coupled circuit includes a pair of NMOS transistors and a pair of PMOS transistors. The second cross-coupled circuit is connected to an output of the first cross-coupled circuit and includes four cross-coupled PMOS transistors. Each of the NMOS transistors and PMOS transistors are fabricated on a substrate using n-well process. An RF voltage source is connected to the RF-DC converter to which an antenna and balun device are connected. An output circuit is connected to the second cross-coupled circuit. Multiple stages identical to the second cross-coupled circuit including only PMOS transistors may be added between the output of the second cross-coupled circuit and the output circuit for greater amplification of the harvested energy.

14 Claims, 13 Drawing Sheets

(51) Int. Cl.
H03K 17/10 (2006.01)
H03K 17/687 (2006.01)

(58) Field of Classification Search
CPC .. H03K 17/10; H03K 17/6872; H03K 17/687; G11C 5/145; G11C 5/146; H02M 3/07; H02M 3/04; H02M 3/06; H02M 3/071; H02M 3/073; H02M 3/076; H02M 3/075; H02M 3/077; H02M 3/078
See application file for complete search history.

(56) References Cited

U.S. PATENT DOCUMENTS

2023/0155692 A1   5/2023   Yoo et al.
2024/0039327 A1*  2/2024   Noghabaei ............... H03H 7/40

OTHER PUBLICATIONS

Nguyen et al. ; RF Energy Harvesting using Cross-coupled Rectifier and DTMOS on SOTB with Phase Effect of Paired RF Inputs ; ECTI Transactions on Electrical Eng., Electronics, and Communications, vol. 18, No. 2 ; Aug. 2020 ; 9 Pages.

Chong et al. ; CMOS Cross-Coupled Differential-Drive Rectifier in Subthreshold Operation for Ambient RF Energy Harvesting-Model and Analysis ; IEEE Transactions on Circuits and Systems II: Express Briefs, vol. 66, Issue 12 ; Jan. 31, 2019 ; Abstract Only ; 1 Page.

Maiellaro et al. ; 40 GHz VCO and Frequency Divider in 28 nm FD-SOI CMOS Technology for Automotive Radar Sensors ; MDPI Electronics ; Aug. 31, 2021 ; 9 Pages.

* cited by examiner

RF-DC CONVERTER FOR ENERGY HARVESTING USING CMOS N-WELL PROCESS

STATEMENT OF ACKNOWLEDGEMENT

The inventors acknowledge the financial support provided by the Deanship of Research Oversight and Coordination, Interdisciplinary Research Center (IRC) for Smart Mobility and Logistics, King Fahd University of Petroleum & Minerals (KFUPM), Riyadh, Saudi Arabia through Project No. SB201018.

BACKGROUND

Technical Field

The present disclosure is directed to energy harvesting technologies and, more particularly, to a direct current (RF-DC) converter fabricated using CMOS N-well process.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

A radio frequency to direct current converter, also known as an RF-DC converter, is a device designed to harvest energy from RF signals and convert it into usable DC voltage. Such a power electronic circuit is particularly significant in the field of energy harvesting, where it is used to capture the energy from ambient radio waves that are already present in the environment. Such converters are vital in applications where RF signals are abundant, and there is a need to power devices without relying on traditional power sources.

Conventional RF-DC converters typically employ Complementary Metal-Oxide-Semiconductor (CMOS) rectifiers as the principal component. Rectification is a process of converting radio frequency (RF) signals into direct current (DC). CMOS technology is particularly preferred for RF-DC conversion due to its low power consumption, high efficiency, and the capability to integrate logic functions.

In RF-DC conversion applications, two primary configurations are prevalent, the cross-coupled differential-drive (CCDD) and the Dickson rectifiers. Both configurations are implemented using CMOS technology. The Dickson rectifier is a type of charge pump circuit that is commonly used for voltage multiplication and is especially useful when a higher DC voltage is needed than what is available from the power supply. The CCDD architecture is a variation of a voltage doubler or multiplier circuit and is particularly used for its efficiency in rectifying high-frequency signals, such as those found in RF energy harvesting.

The CCDD architecture consists of two pairs of transistors that are cross-coupled. This means that each transistor in a pair is connected in a way that its operation affects the other. Typically, one pair is made up of NMOS transistors and the other of PMOS transistors. For applications necessitating multiple stages to achieve elevated DC output voltages, such designs are often realized using a twin-well CMOS process. The twin well CMOS process is a manufacturing technique for integrated circuits, particularly in CMOS technology. It is characterized by the creation of both n-well and p-well regions in a silicon substrate to house the transistors. The twin well CMOS process is beneficial in applications requiring high-performance ICs with greater reliability and precise control over the electrical properties of the transistors. However, the twin-well process incurs higher manufacturing costs.

Patent Application CN108306425A describes a reconfigurable CMOS radio-frequency energy collecting system, comprising a low-power branch, which is used for converting low-power radio frequency energy into DC energy and a high-power branch for the high power radio frequency energy into DC energy, comprising a rectifier and a control circuit. The second stage includes PMOS and NMOS transistors. However, said system suffers from lack of efficiency and increased complexity of having different powered branches.

Patent Application US20230155692A1 describes an energy-harvesting power receiver which receives an electrical signal from a body electrode and rectifies the electrical signal. The transistors are bulk-biased and the cross-coupled. The second stage includes PMOS and NMOS transistors. Said receiver is complex to build and is expensive to manufacture.

Each of the aforementioned techniques suffers from one or more drawbacks hindering their adoption. For example, the existing technologies do not mention body biasing to the source of each transistor and a different configuration of the components, enabling the circuit to consume less space, and typically employing a twin-well process for fabrication, resulting in higher maintenance costs.

Accordingly, it is one object of the present disclosure to provide circuits, methods and systems for providing an RF-DC converter for energy harvesting having a compact component configuration and incurring lower manufacturing cost.

SUMMARY

In an exemplary embodiment, a radio frequency to direct current (RF-DC) converter is described. The RF-DC converter includes a first cross-coupled circuit and a second cross-coupled circuit. The first cross-coupled circuit includes a first NMOS transistor, a first PMOS transistor, a second NMOS transistor, and a second PMOS transistor. Each of the first NMOS transistor, the second NMOS transistor, the first PMOS transistor, and the second PMOS transistor are fabricated on a substrate by an n-well process.

The second cross-coupled circuit is connected to an output of the first cross-coupled circuit. The second cross-coupled circuit includes a third PMOS transistor, a fourth PMOS transistor, a fifth PMOS transistor, and a sixth PMOS transistor. Each of the third PMOS transistor, the fourth PMOS transistor, the fifth PMOS transistor and the sixth PMOS transistor are fabricated on the substrate by the n-well process.

The RF-DC converter further includes an RF voltage source.

In another exemplary embodiment, a radio frequency to direct current (RF-DC) converter includes an antenna and a cross-coupled differential-drive (CCDD) rectifier. The antenna is configured to receive radio frequency (RF) signals.

The cross-coupled differential-drive (CCDD) rectifier is connected to the antenna. The CCDD rectifier includes a series connected first cross-coupled circuit and second cross-coupled circuit.

The first cross-coupled circuit includes a first NMOS transistor, a first PMOS transistor, a second NMOS transistor, and a second PMOS transistor. Each of the first NMOS transistor, the second NMOS transistor, the first PMOS transistor, and the second PMOS transistor are fabricated by an n-well process on a substrate. The first capacitor is connected to a drain terminal of the first NMOS transistor and to a drain terminal of the first PMOS transistor. A second capacitor is connected to a drain terminal of the second NMOS transistor and to a drain terminal of the second PMOS transistor. A ground terminal is connected to a body terminal and to a source terminal of the first NMOS transistor and to a body terminal and to a source terminal of the second NMOS transistor. A first cross-coupling connector is connected to a gate of the first NMOS transistor, to a gate of the first PMOS transistor, and to the second capacitor. A second cross-coupling connector is connected to a gate of the second NMOS transistor, to a gate of the second PMOS transistor and to the first capacitor.

The second cross-coupled circuit includes a third PMOS transistor, a fourth PMOS transistor, a fifth PMOS transistor, and a sixth PMOS transistor. Each of the third PMOS transistor, the fourth PMOS transistor, the fifth PMOS transistor, and the sixth PMOS transistor are fabricated on the substrate by the n-well process. A third capacitor is connected to a source terminal of the third PMOS transistor and to a source terminal of the fifth PMOS transistor. A fourth capacitor is connected to a source terminal of the second PMOS transistor and to a source terminal of the sixth PMOS transistor. A connecting terminal is configured to connect a body terminal and a source terminal of the first PMOS transistor and a body terminal and a source terminal of the second PMOS transistor to a body terminal and a drain terminal of the third PMOS transistor and to a body terminal and a drain terminal of the fourth PMOS transistor. A third cross-coupling connector is connected to a gate of the third PMOS transistor, to a gate of the sixth PMOS transistor and to the third capacitor. A fourth cross-coupling connector is connected to a gate of the fourth PMOS transistor, to a gate of the fifth PMOS transistor and to the third capacitor.

In another exemplary embodiment, a method includes connecting an antenna configured to receive radio (RF) signals to a balun. The balun is configured to convert the RF signals to a positive alternating voltage at a positive alternating voltage terminal and to a negative alternating voltage at a negative alternating voltage terminal. The method further includes connecting a cross-coupled differential-drive (CCDD) rectifier to the positive alternating voltage terminal and the negative alternating voltage terminal.

The CCDD rectifier includes a series connected first cross-coupled circuit and second cross-coupled circuit. The first cross-coupled circuit includes a first NMOS transistor, a first PMOS transistor, a second NMOS transistor, and a second PMOS transistor. Each of the first NMOS transistor, the second NMOS transistor, the first PMOS transistor, and the second PMOS transistor are fabricated by an n-well process. The first cross-coupled circuit further includes a first capacitor connected to a drain terminal of the first NMOS transistor and to a drain terminal of the first PMOS transistor, a second capacitor connected to a drain terminal of the second NMOS transistor and to a drain terminal of the second PMOS transistor, a ground terminal connected to a body terminal and to a source terminal of the first NMOS transistor and to a body terminal and to a source terminal of the second NMOS transistor, a first cross-coupling connector connected to a gate of the first NMOS transistor, to a gate of the first PMOS transistor and to the second capacitor, and a second cross-coupling connector connected to a gate of the second NMOS transistor, to a gate of the second PMOS transistor and to the first capacitor.

The second cross-coupled circuit includes a third PMOS transistor, a fourth PMOS transistor, a fifth PMOS transistor, and a sixth PMOS transistor. Each of the third PMOS transistor, the fourth PMOS transistor, the fifth PMOS transistor, and the sixth PMOS transistor are fabricated on the substrate by the n-well process. The second cross-coupled circuit further includes a third capacitor connected to a source terminal of the third PMOS transistor and to a source terminal of the fifth PMOS transistor, a fourth capacitor connected to a source terminal of the fourth PMOS transistor and to a source terminal of the sixth PMOS transistor, a third cross-coupling connector connected to a gate of the third PMOS transistor, to a gate of the sixth PMOS transistor and to the third capacitor, and a fourth cross-coupling connector connected to a gate of the fourth PMOS transistor, to a gate of the fifth PMOS transistor and to the fourth capacitor.

In one aspect, the method further includes connecting a first end of a connecting terminal to a body terminal and a source terminal of the first PMOS transistor and to a body terminal and a source terminal of the second PMOS transistor, connecting a second end of the connecting terminal to a drain terminal of the third PMOS transistor and to a drain terminal of the fourth PMOS transistor, connecting a first end of an output terminal of the second cross-coupled circuit to the body terminal and to the drain terminal of the fifth PMOS transistor and to a body terminal and to a drain terminal of the sixth PMOS transistor, converting the RF energy to a positive DC voltage at the output terminal by charging the second capacitor and the fourth capacitor during a positive half cycle of the alternating voltage and converting the RF energy to a positive DC voltage at the output terminal by charging the first capacitor and the third capacitor during a negative half cycle of the alternating voltage.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1A:
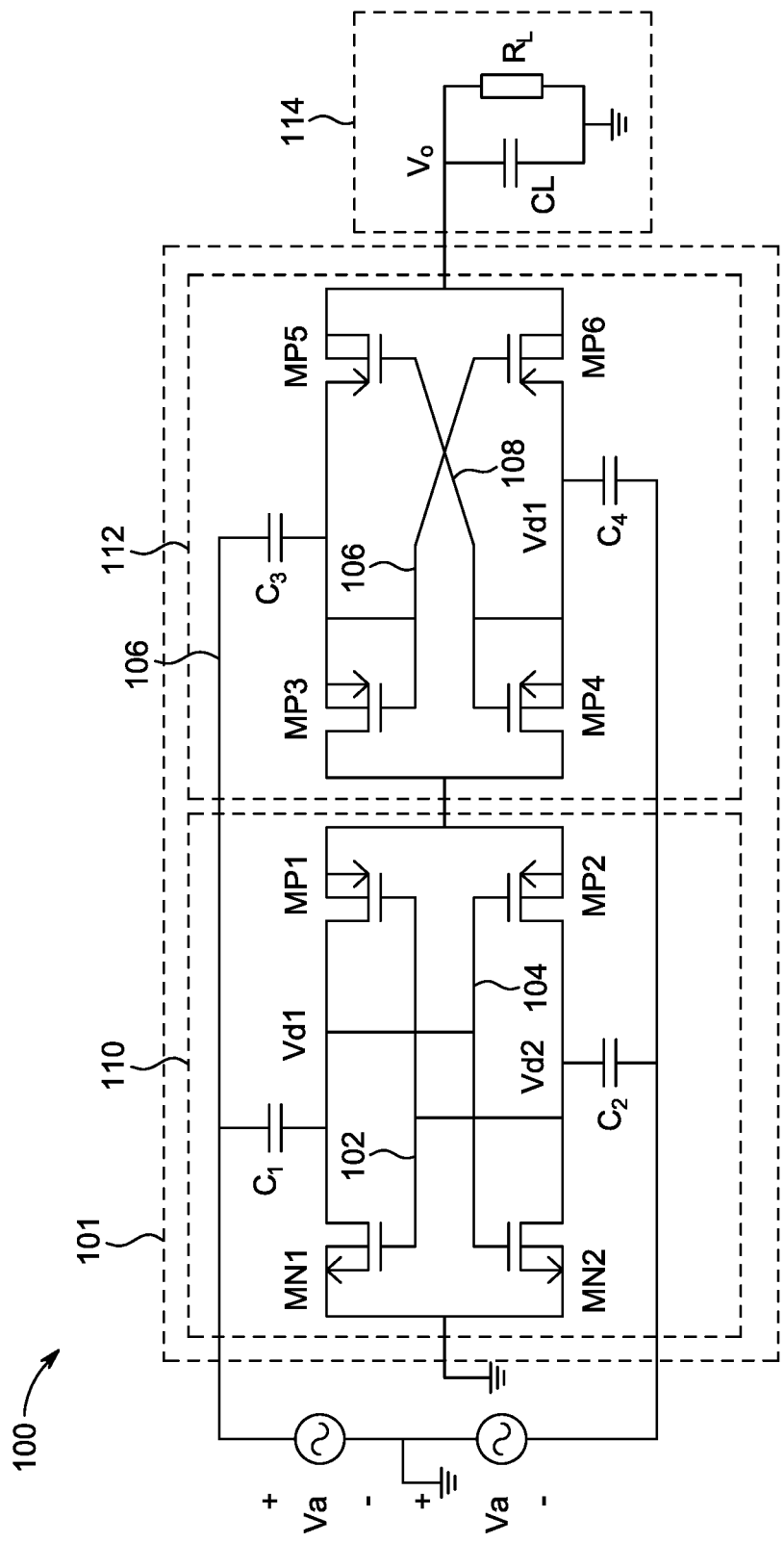
FIG. 1A is a circuit diagram of a radio frequency to direct current (RF-DC) converter, according to certain embodiments.

In the drawings, like reference numerals designate identical or corresponding parts throughout the several views.

Further, as used herein, the words "a", "an" and the like generally carry a meaning of "one or more", unless stated otherwise.

Furthermore, the terms "approximately," "approximate", "about" and similar terms generally refer to ranges that include the identified value within a margin of 20%, 10%, or preferably 5%, and any values therebetween.

Aspect of this disclosure are directed to a radio frequency to direct current (RF-DC) converter. The RF-DC converter includes two stages which generate a high output voltage. The first stage includes a cross-coupled differential drive (CCDD) rectifier, which consists of N-type metal-oxide-semiconductor (NMOS) and P-type metal-oxide-semiconductor (PMOS) transistors. The second stage comprises only PMOS transistors. Due to a defined configuration of PMOS transistors at the second stage, the rectifier can be fabricated using a n-well fabrication. The specific configuration of PMOS transistors at the second stage and the utilization of the n-well fabrication process result in a compact design with significantly economic manufacturing costs.

FIG. 1A is a circuit diagram of a radio frequency to direct current (RF-DC) converter 100, in accordance with certain embodiments. The RF-DC converter 100 is implemented in applications where RF signals are abundant and there is a need to power devices without relying on traditional power sources. The RF-DC converter 100 can be designed for a wide range of frequencies, intended to convert RF signals into DC voltages for energy harvesting applications, such as RF-powered sensors or devices. The conversion process typically involves taking the DC power from near-field electromagnetic waves with the minimum possible power loss at RF frequencies.

The RF-DC converter 100 includes, but is not limited to, an antenna 120 and a cross-coupled differential-drive (CCDD) rectifier 101. The antenna 120 is configured to receive radio frequency (RF) signals across a designated range of the electromagnetic spectrum. The antenna 120 structure is composed of a conductive element designed with precise dimensional attributes to resonate at targeted frequencies, thus ensuring optimal reception and conversion efficiency.

The CCDD rectifier 101 features at least two cross-coupled arrangements of pairs of complementary metal-oxide-semiconductor (CMOS) transistors configured to form a self-regulating differential-drive system, as described below. The configuration of cross-coupling of NMOS and PMOS transistors creates a reciprocal activation mechanism that significantly amplifies the rectification of high-frequency RF signals by enforcing rapid switching actions and minimizing transitional losses.

The RF-DC converter 100 illustrated in FIG. 1A includes two cross-coupled circuits, a first cross-coupled circuit 110 and a second cross-coupled circuit 112. The cross-coupled circuit is a configuration within an electronic design that typically refers to a pair or pairs of transistors arranged such that each transistor's output is connected to the input of another transistor. The cross-coupled circuit configuration creates a feedback loop that can be used for various purposes, such as amplification, oscillation, or signal rectification. The cross-coupled circuit of FIG. 1A are configured for signal rectification. The cross-coupled circuits include NMOS and PMOS transistors. NMOS and PMOS are the two main types of MOSFETs (Metal-Oxide-Semiconductor Field-Effect Transistors) used in integrated circuits, particularly in CMOS technology.

The first cross-coupled circuit 110 includes a first NMOS transistor MN1, a first PMOS transistor MP1, a second NMOS transistor MN2, and a second PMOS transistor MP2. All transistors of the first cross-coupled circuit 110, including each of the first NMOS transistor MN1, the second NMOS transistor MN2, the first PMOS transistor MP1, and the second PMOS transistor MP2, are fabricated on a substrate by an n-well process. The n-well process is a fabrication technique used in the CMOS integrated circuit technology. The n-well process creates the necessary environments for both NMOS and PMOS transistors on a single silicon wafer. The substrate is the base material upon which devices such as transistors are constructed. The substrate typically begins as a high-purity, single-crystal silicon wafer. P-type substrates are commonly used for the n-well process, meaning the silicon is doped with elements, such as boron that create positive charge carriers (holes). An n-type dopant, such as phosphorus, is used to dope "wells" within the p-type substrate to form the n-wells.

The first cross-coupled circuit uses both NMOS and PMOS transistors. NMOS transistor have an ON resistance of about half that of a PMOS transistor, thus are faster in switching. Additionally, an NMOS transistor has a smaller footprint than a PMOS transistor for the same output current, thus the circuit can be physically smaller. PMOS transistors are less prone to noise than NMOS transistors as they have a low leakage current, thus are used advantageously to provide a stable current output.

A key difference between PMOS and NMOS transistors lies in their threshold voltages. For a PMOS transistor, the threshold voltage is typically negative, whereas it is positive for an NMOS transistor. Consequently, a PMOS transistor is turned on by applying a negative gate-source voltage, while an NMOS transistor is turned on by applying a positive gate-source voltage. Typical threshold voltages of NMOS transistors are in the range of 0.4 V to 0.5 V. Typical threshold voltages of PMOS transistors are in the range of −0.4 V to −0.5 V.

The small footprint of the cross-coupled circuits using NMOS and PMOS transistors reduces the chip size, thus more circuit components can be integrated in a single chip, thereby reducing the parasitic capacitances, power consumption, and cost of production and increasing the operating speed.

In forming the p-wells, doping concentrations of boron in the range of $2\times10^{18}$ cm$^3$ to $4\times10^{18}$ cm$^3$ were used. In forming the n-wells, doping concentrations of phosphorus in the range of $1\times10^{19}$ cm$^3$ to $2\times10^{19}$ cm$^3$ were used.

The first cross-coupled circuit 110 includes a first capacitor C1 and a second capacitor C2. The first capacitor C1 is connected to a drain terminal of the first NMOS transistor MN1 and to a drain terminal of the first PMOS transistor MP1. The second capacitor C2 is connected to a drain terminal of the second NMOS transistor MN2 and to a drain terminal of the second PMOS transistor MP2.

The first cross-coupled circuit 110 further includes a ground terminal connected to a body terminal and to a source terminal of the first NMOS transistor MN1 and to a body terminal and to a source terminal of the second NMOS transistor MN2.

The first cross-coupled circuit 110 further includes a first cross-coupling connector 102 connected to a gate of the first NMOS transistor MN1, to a gate of the first PMOS transistor MP1 and to the second capacitor C2. Further, a second cross-coupling connector 104 is connected to a gate of the second NMOS transistor MN2, to a gate of the second PMOS transistor MP2 and to the first capacitor C1. An output terminal of the first cross-coupled circuit 110 is connected to a source terminal and a body terminal of the first PMOS transistor MP1 and to a source terminal and a body terminal of the second PMOS transistor MP2.

The output of the first cross-coupled circuit 110 is fed to the second cross-coupled circuit 112. In one aspect, the second cross-coupling connector 104 is connected to a gate of the second NMOS transistor MN2, to a gate of the second PMOS transistor MP2 and to the first capacitor C1.

The second cross-coupled circuit 112 includes a third PMOS transistor MP3, a fourth PMOS transistor MP4, a fifth PMOS transistor MP5, and a sixth PMOS transistor MP6. It is to be noted that the second cross-coupled circuit 112 includes PMOS transistors and excludes NMOS transistors. Each of the third PMOS transistor MP3, the fourth PMOS transistor MP4, the fifth PMOS transistor MP5, and the sixth PMOS transistor MP6 are fabricated on the substrate by the n-well process.

The second cross-coupled circuit 112 further includes two capacitors, a third capacitor C3 and a fourth capacitor C4. The third capacitor C3 is connected to a source terminal of the third PMOS transistor MP3 and to a source terminal of the fifth PMOS transistor MP5. The fourth capacitor C4 is connected to a source terminal of the second PMOS transistor MP2 and to a source terminal of the sixth PMOS transistor MP6.

The second cross-coupled circuit 112 further includes an input terminal which is connected to a body terminal and a source terminal of the first PMOS transistor MP1 and a body terminal and a source terminal of the second PMOS transistor MP2. The input terminal of the second cross-coupled circuit 112 is connected to a body terminal and a drain terminal of the third PMOS transistor MP3 and to a body terminal and a drain terminal of the fourth PMOS transistor MP4.

A third cross-coupling connector 106 is connected to a gate of the third PMOS transistor MP3, to a gate of the sixth PMOS transistor MP6 and to the third capacitor C3.

A fourth cross-coupling connector 108 is connected to a gate of the fourth PMOS transistor MP4, to a gate of the fifth PMOS transistor MP5 and to the third capacitor C3.

An output terminal of the second cross-coupled circuit 112 is connected at a first end to the source terminal of the fifth PMOS transistor MP5 and to the source terminal and the body terminal of the sixth PMOS transistor MP6, and at a second end to the ground terminal.

In an aspect, an RC load circuit is connected to the output terminal of the second cross-coupled circuit 112. The RC load circuit comprises a load capacitor ($C_L$) and a load resistor ($R_L$) connected in parallel. The output voltage Vo is measured at the RC load circuit.

Figure 1B:
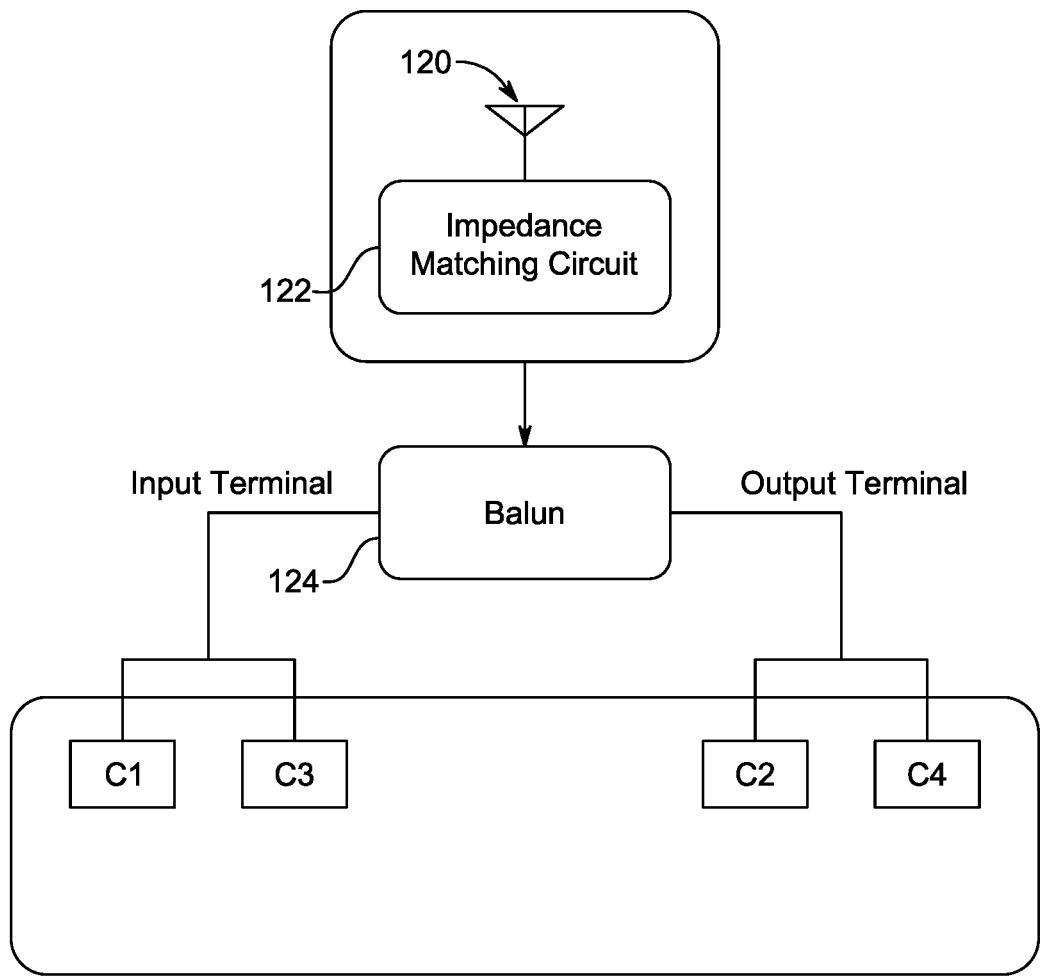
FIG. 1B is a schematic diagram of the RF-DC converter, according to certain embodiments.

In order to provide the harvested energy to the circuit of FIG. 1A, an RF voltage source Va is connected to the RF-DC converter 100. FIG. 1B is a schematic diagram of the RF-DC converter 100. The antenna 120 is configured to receive an RF signal. In an aspect, an impedance matching circuit 122 is connected to the antenna 120 of the RF-DC converter 100. The impedance matching circuit 122 is configured to match an impedance of the RF energy of the surrounding environment to the impedance of the antenna 120. The antenna 120 is connected to an input terminal of the balun 124.

The balun 124 is connected to the RF voltage source Va. The balun 124 is a device that converts an unbalanced (single-ended) AC signal into a balanced (differential) AC signal. A balun 124 can take various forms. The most commonly used for low-frequency RF signals, such as IoT devices and TV antenna 120, is a simple transformer or set of coupled inductors. The balun 124 is configured to convert the RF signals received at the antenna 120 to a positive alternating voltage at a positive alternating voltage terminal and to a negative alternating voltage at a negative alternating voltage terminal. A positive output terminal of the balun 124 is connected to the first capacitor C1 and the third capacitor C3, and a negative output terminal of the balun 124 is connected to the second capacitor C2 and the fourth capacitor C4.

According to one aspect of the present disclosure, the first capacitor C1, the second capacitor C2, the third capacitor C3 and the fourth capacitor C4 are of equal capacitance. However, in other aspects, the first capacitor C1, the second capacitor C2, the third capacitor C3 and the fourth capacitor C4 may be of different values.

In a non-limiting example, the first capacitor C1, the second capacitor C2, the third capacitor C3 and the fourth capacitor C4 each have a capacitance value of 2 pF.

Figure 2A:
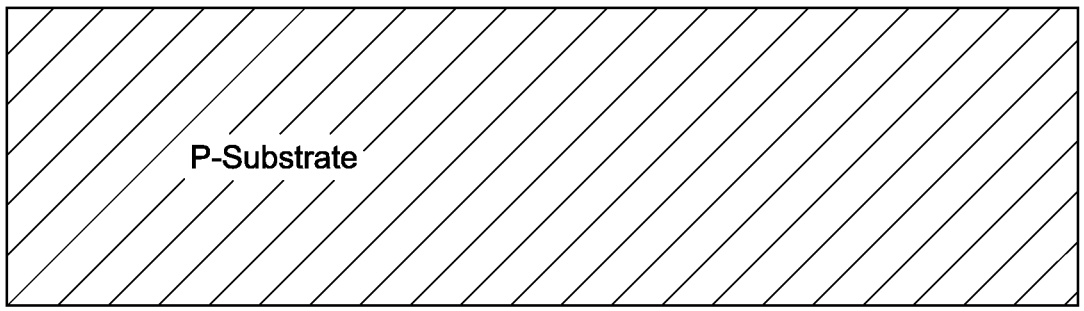
FIG. 2A illustrates a substrate used in the n-well fabrication of the RF-DC converter, according to certain embodiments.
Figure 2B:
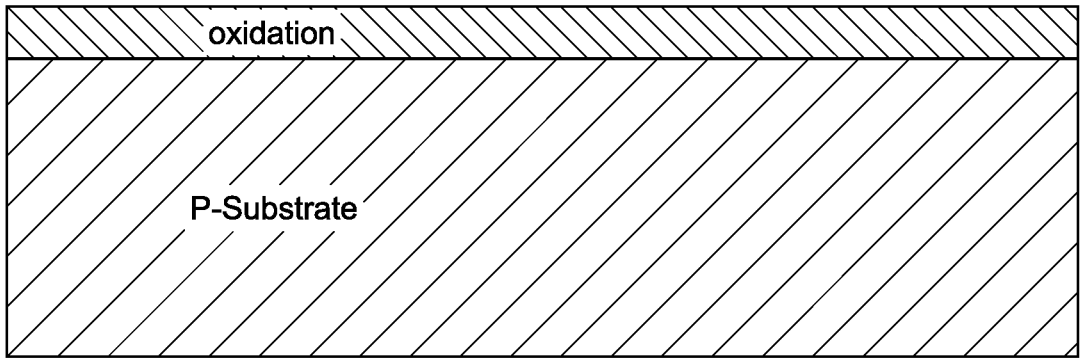
FIG. 2B illustrates an oxidation step in the n-well fabrication of the RF-DC converter, according to certain embodiments.
Figure 2C:
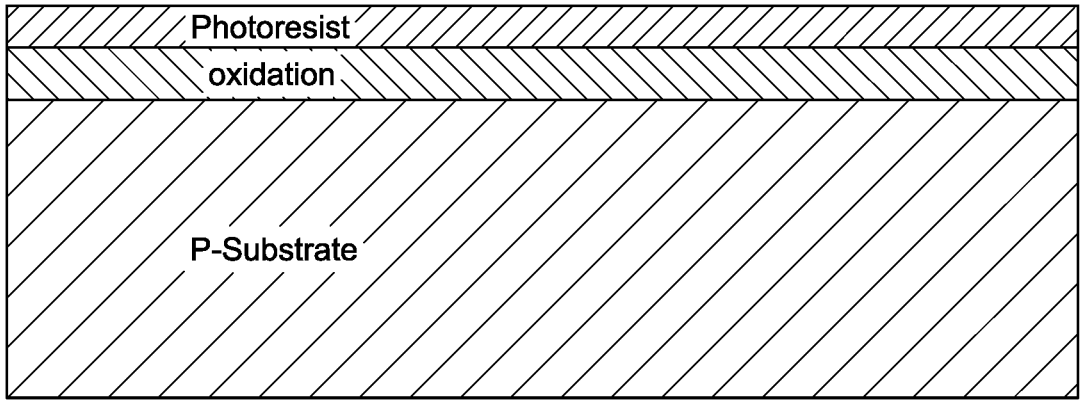
FIG. 2C illustrates a patterning step in the n-well fabrication of the RF-DC converter, according to certain embodiments.
Figure 2D:
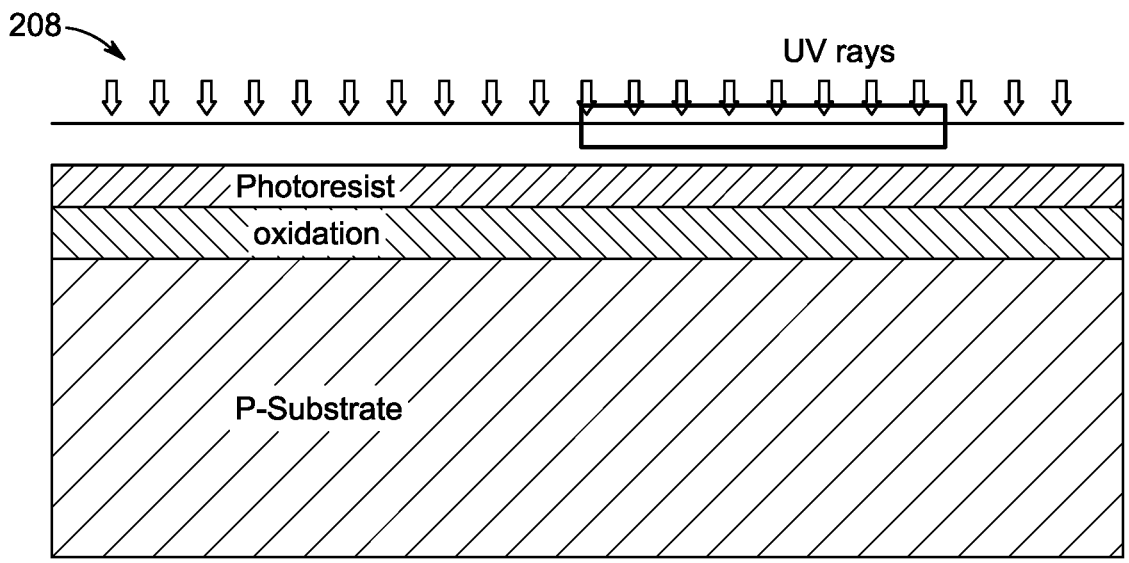
FIG. 2D illustrates a masking step in the n-well fabrication of the RF-DC converter, according to certain embodiments.
Figure 2E:
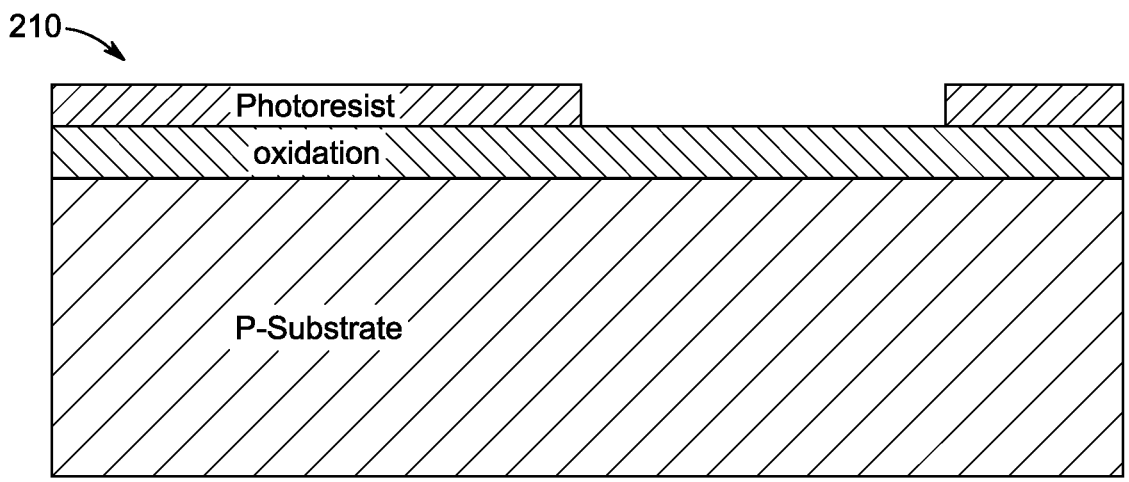
FIG. 2E illustrates etching of the mask in the n-well fabrication of the RF-DC converter, according to certain embodiments.
Figure 2F:
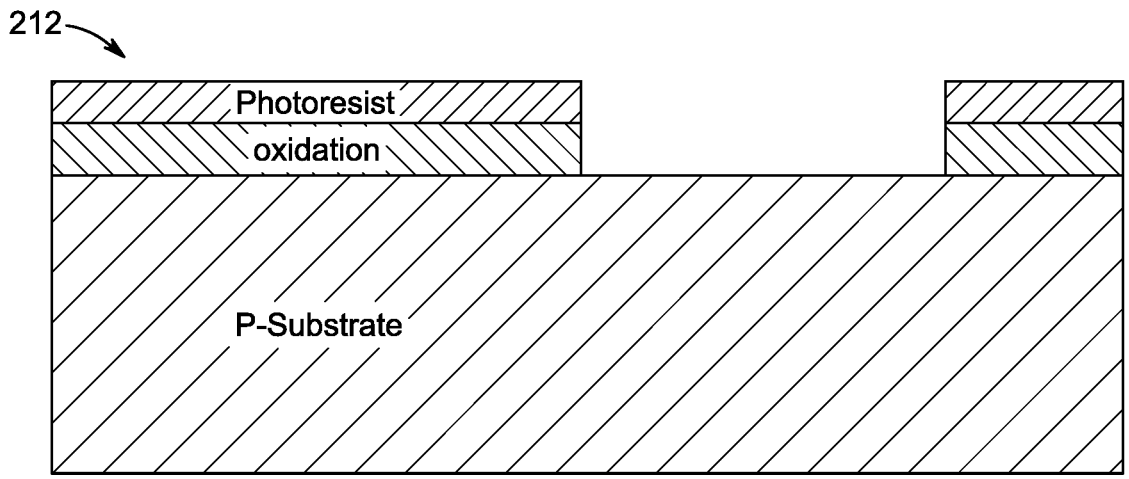
FIG. 2F illustrates a cleaning step in the n-well fabrication of the RF-DC converter, according to certain embodiments.
Figure 2G:
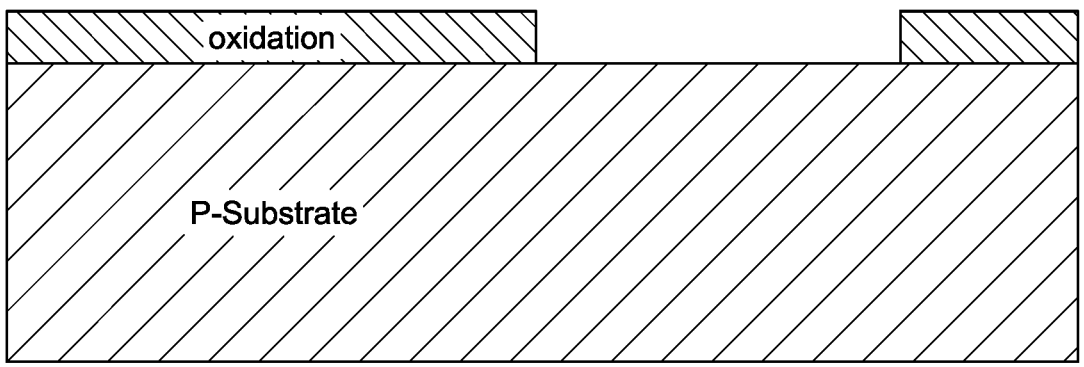
FIG. 2G illustrates a stripping of the photoresist step in the n-well fabrication of the RF-DC converter, according to certain embodiments.
Figure 2H:
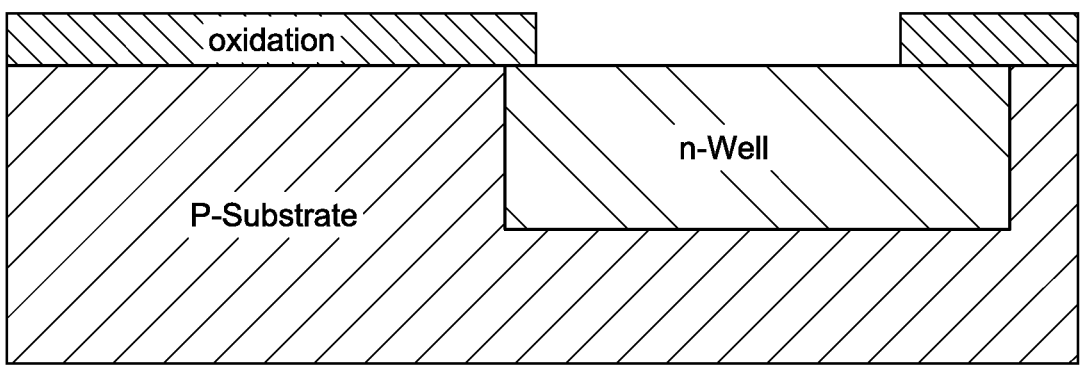
FIG. 2H illustrates a dopant implantation step in the n-well fabrication of the RF-DC converter, according to certain embodiments.
Figure 2I:
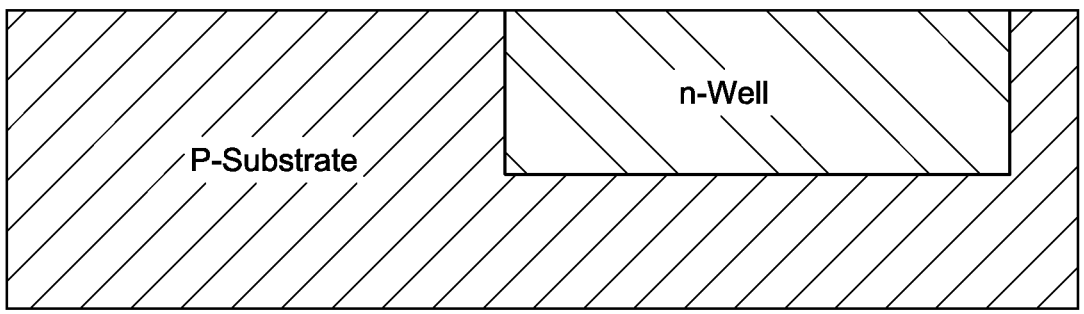
FIG. 2I illustrates a removal of the dopant mask in the n-well fabrication of the RF-DC converter, according to certain embodiments.
Figure 2J:
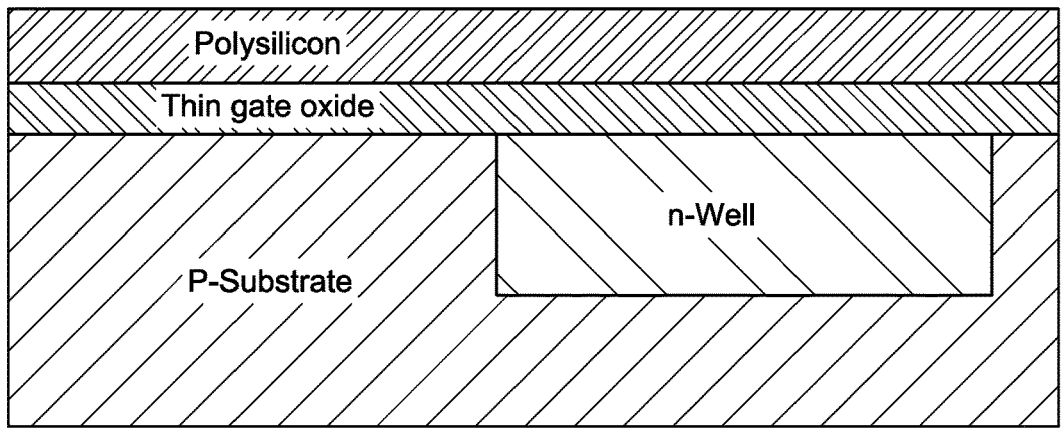
FIG. 2J illustrates a patterning step in the n-well fabrication of the RF-DC converter, according to certain embodiments.
Figure 2K:
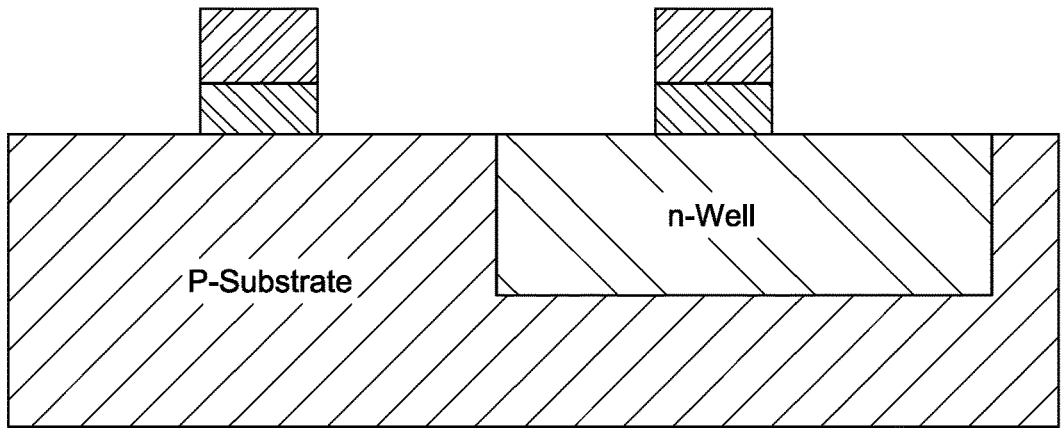
FIG. 2K illustrates an etching step in the n-well fabrication of the RF-DC converter, according to certain embodiments.
Figure 2L:
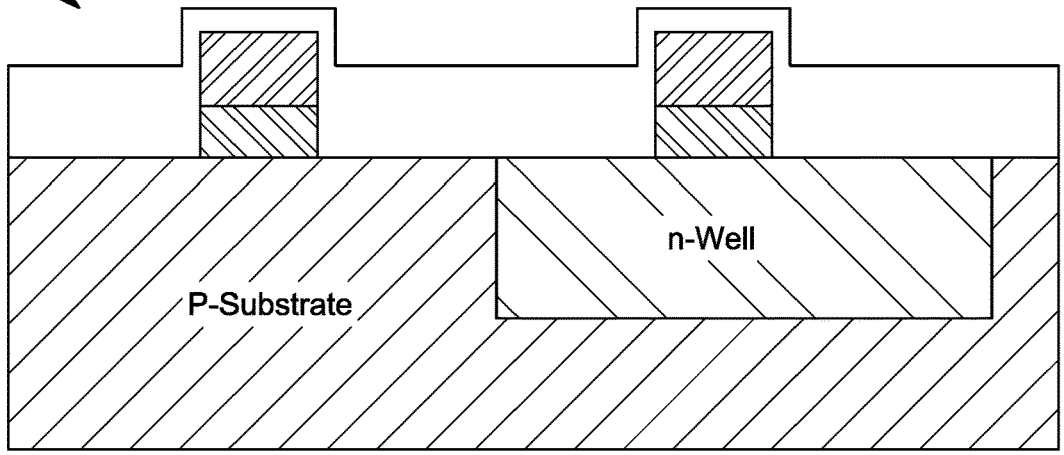
FIG. 2L illustrates depositing an oxide layer in the n-well fabrication of the RF-DC converter, according to certain embodiments.
Figure 2M:
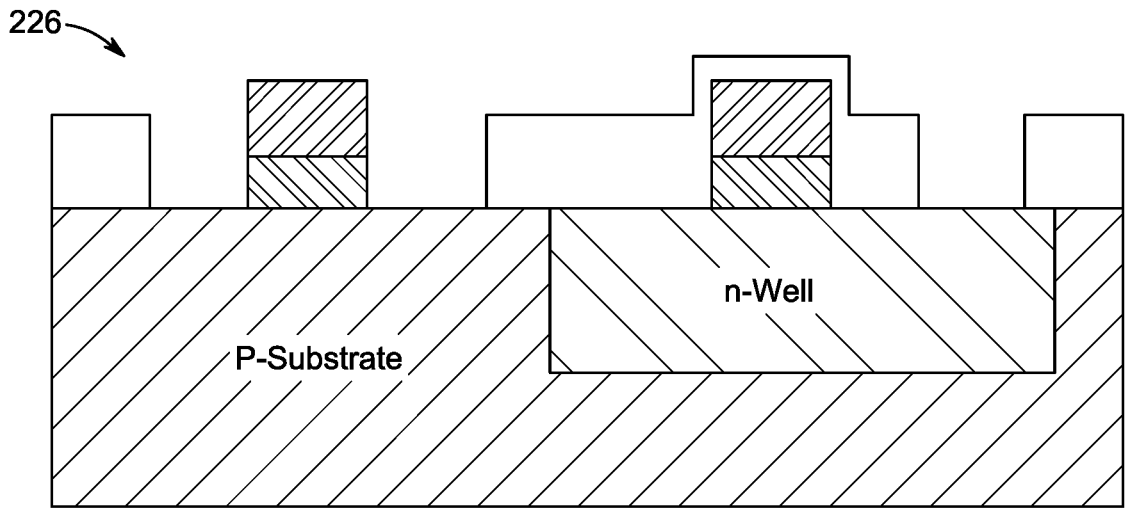
FIG. 2M illustrates a masking and etching step in the n-well fabrication of the RF-DC converter, according to certain embodiments.
Figure 2N:
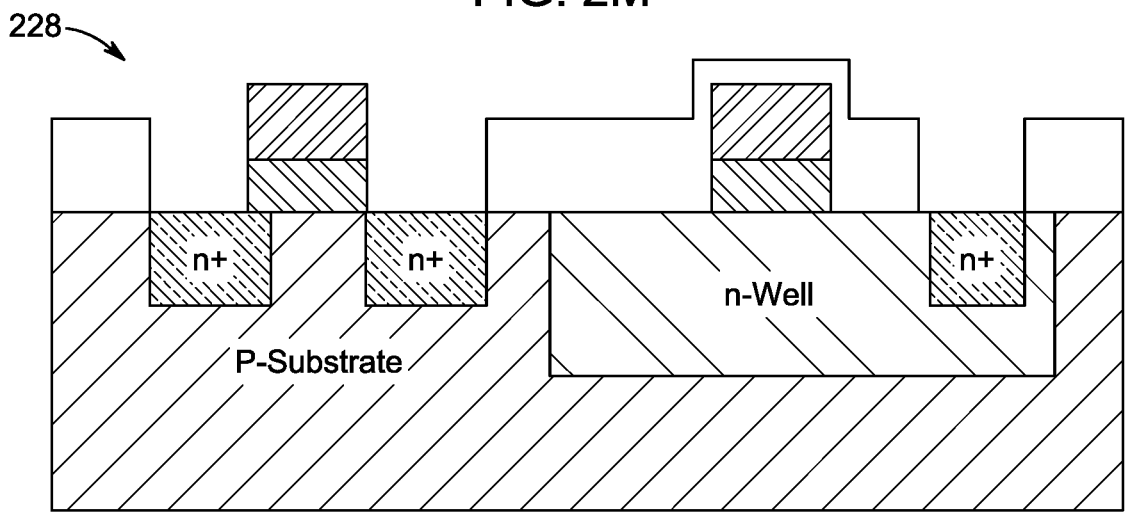
FIG. 2N illustrates a removal of the mask in the n-well fabrication of the RF-DC converter, according to certain embodiments.
Figure 2O:
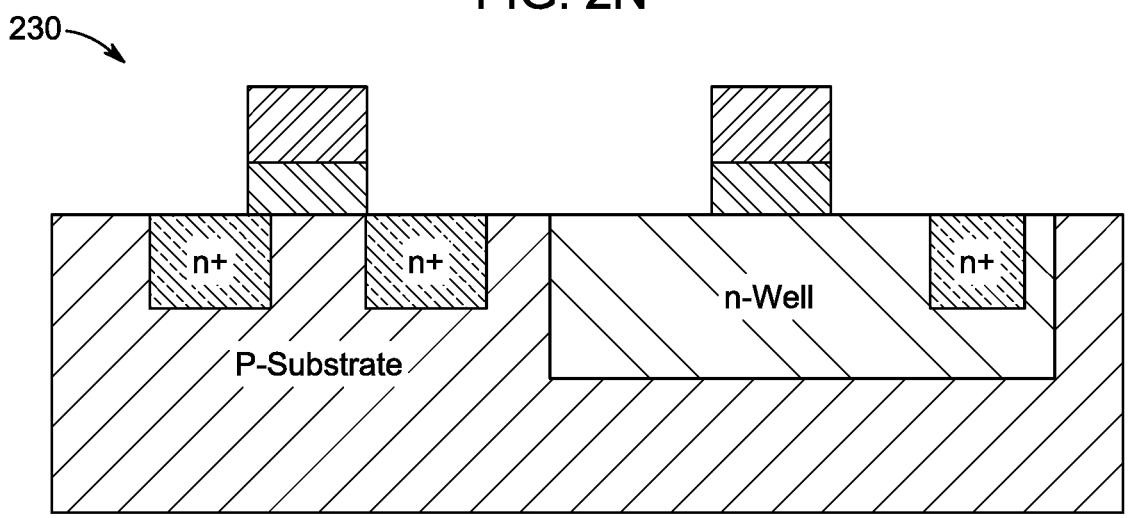
FIG. 2O illustrates a p-type diffusion process in the n-well fabrication of the RF-DC converter, according to certain embodiments.
Figure 2P:
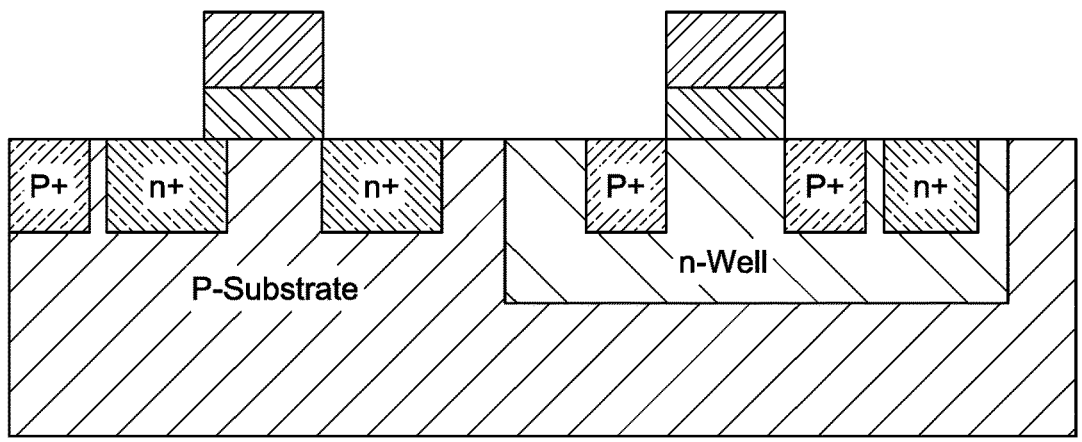
FIG. 2P illustrates the deposition of a thick field oxide layer in the n-well fabrication of the RF-DC converter, according to certain embodiments.
Figure 2Q:
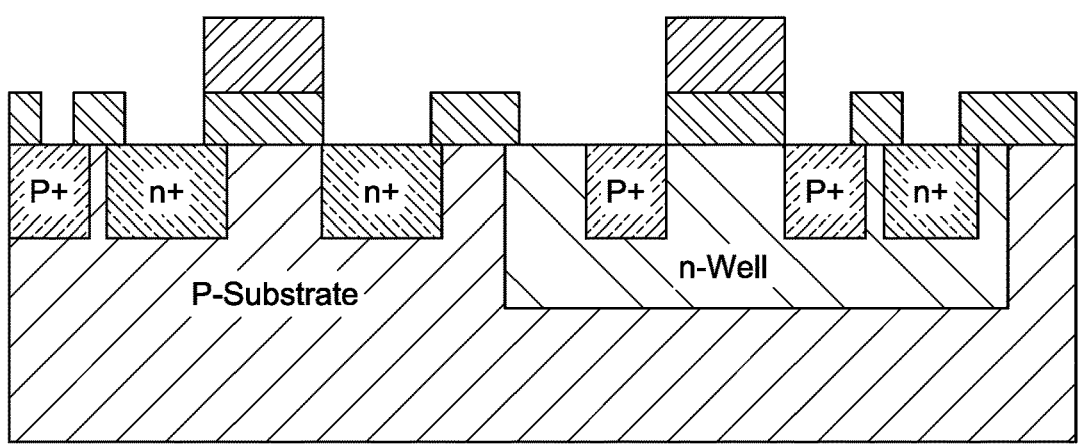
FIG. 2Q illustrates deposition of an aluminum layer in the n-well fabrication of the RF-DC converter, according to certain embodiments.
Figure 2R:
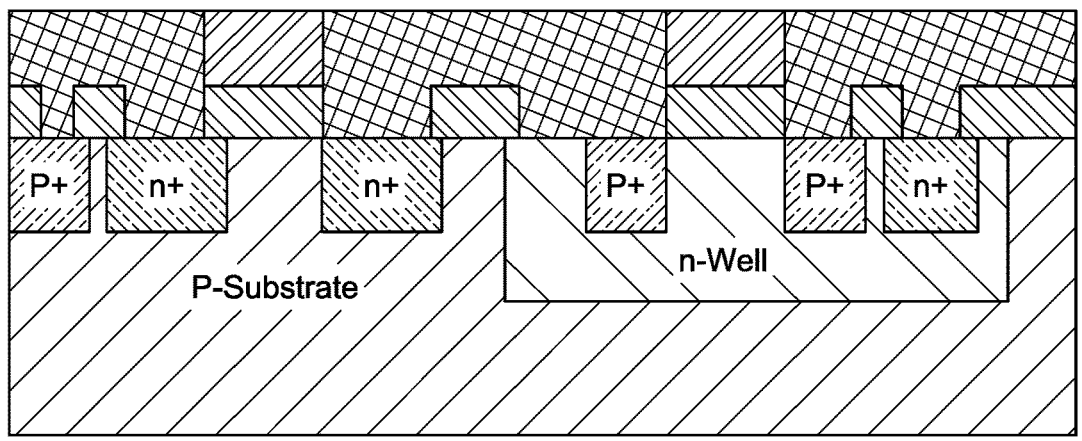
FIG. 2R illustrates a patterning of the aluminum step in the n-well fabrication of the RF-DC converter, according to certain embodiments.
Figure 2S:
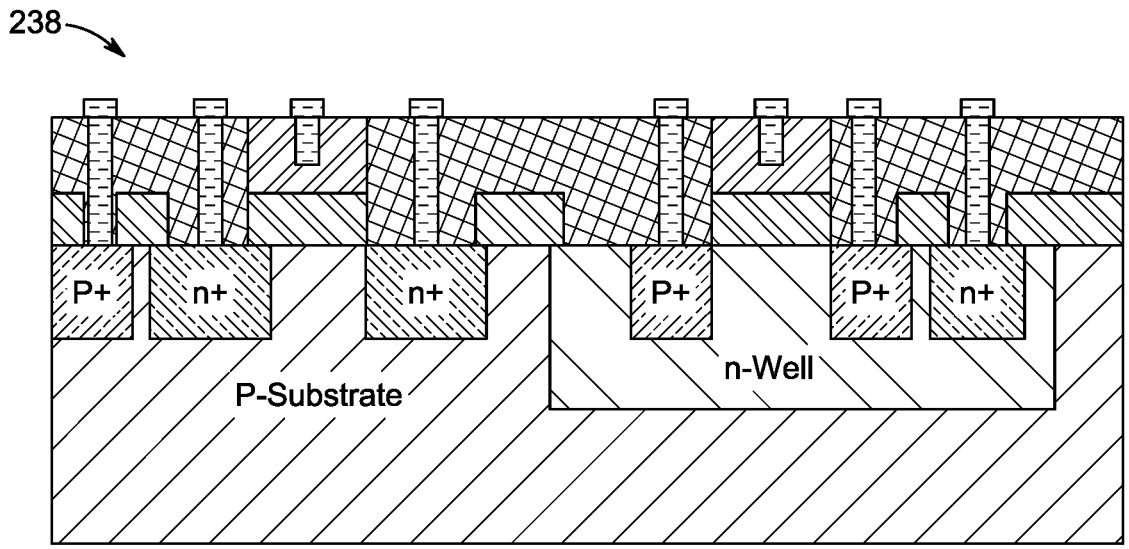
FIG. 2S illustrates formation of terminals in the n-well fabrication of the RF-DC converter, according to certain embodiments.
Figure 2T:
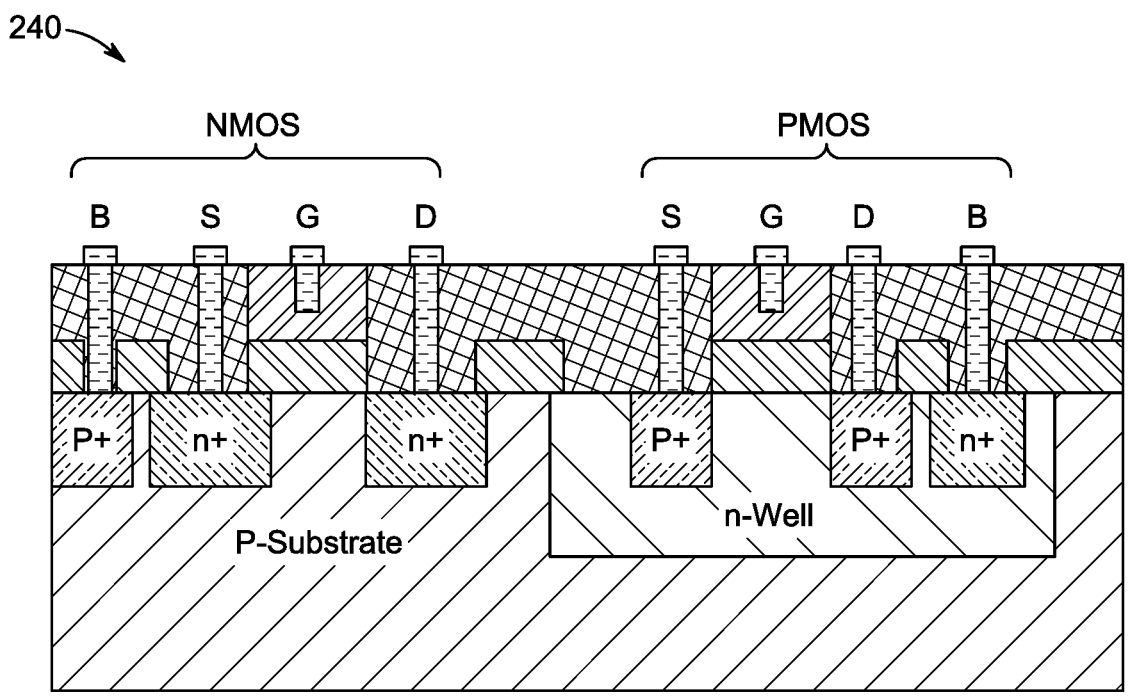
FIG. 2T illustrates the assignment of names to the terminals of the RF-DC converter, according to certain embodiments.

FIG. 2A-FIG. 2T illustrate various steps involved in the n-well process fabrication.

The CMOS fabrication using the n-well method begins by selecting a p-type silicon substrate as the foundational material, as shown at block 202 (shown in FIG. 2A). The substrate is then subjected to an oxidation process, where it is exposed to high-temperature oxygen and hydrogen within an oxidation furnace at around 1000 degrees Celsius, at step 204 (shown in FIG. 2B). This step creates a protective layer of silicon dioxide (SiO2) on the substrate's surface, which shields specific areas during subsequent doping.

Following oxidation, the wafer is prepared for patterning through a process known as photolithography at step 206 (shown in FIG. 2C). A photosensitive film is uniformly applied over the SiO2 layer, serving as a photoresist. At step 208, the next phase involves masking, where a stencil outlining the desired pattern is placed over the photoresist (shown in FIG. 2D). Exposure to ultraviolet light hardens the photoresist beneath the open areas of the mask, defining the areas for the next steps in the fabrication process.

At step 210, after removing the mask, the wafer undergoes development where the portions of photoresist that weren't exposed to UV light are dissolved away using a solvent such as trichloroethylene (shown in FIG. 2E).

At step 212, the wafer is dipped into a hydrofluoric acid solution to etch away the SiO2 layer from designated areas, preparing them for the introduction of dopants (shown in FIG. 2F).

At step 214, the entire photoresist is stripped from the wafer using a chemical like hot sulfuric acid (H2SO4), leaving behind only the patterned SiO2 (shown in FIG. 2G).

At step 216, n-type dopants are diffused into the p-type substrate through the cleared SiO2 areas, creating an n-well (shown in FIG. 2H). The n-type dopant is preferably phosphorus. However, the n-type dopant may be selected from the group consisting of phosphorus, arsenic and antimony.

Step 218 involves the removal of the remaining SiO2 using hydrofluoric acid once again (shown in FIG. 2I).

Step 220 includes a deposition of polysilicon on the wafer (shown in FIG. 2J). The misalignment of the gate of a CMOS transistor would lead to unwanted capacitance, which could harm the circuit. As a prevention, a "Self-aligned gate process" is preferred where gate regions are formed before the formation of source and drain using ion implantation. Polysilicon is used for formation of the gate because it can withstand high temperatures greater than 800 C when a wafer is subjected to annealing methods for formation of source and drain. Polysilicon is deposited by using chemical deposition process (CDP) over a thin layer of gate oxide. Such thin gate oxide under the polysilicon layer prevents further doping under the gate region.

At step 222, the excess polysilicon is etched away, except in areas in which the gates of the NMOS and PMOS transistors will be located (shown in FIG. 2K).

Step 224 entails depositing another layer of oxide over the wafer to safeguard against future diffusion and metallization processes (shown in FIG. 2L).

At step 226, the wafer is masked and etched to create openings for the diffusion of n-type impurities, which will form three n+ regions for the NMOS terminals (shown in FIG. 2M). The n-type impurities are selected from the group including phosphorus, arsenic and antimony. In a non-limiting example, the n-type impurity is phosphorus.

The process then proceeds to the next step 210, as shown in step 228, where the recently deposited oxide layer is removed (shown in FIG. 2N).

At step 230, a p-type diffusion process is carried out to establish the terminals for the PMOS transistors (shown in FIG. 2O). The p-type dopant is selected from the group consisting of boron, aluminum and indium. In a non-limiting example, the p-type dopant is boron.

Step 232 involves the deposition of a thick field oxide layer to protect areas of the wafer that do not require terminals (shown in FIG. 2P).

At step 234, a layer of aluminium is spread across the entire wafer for metallization, creating the groundwork for interconnections (shown in FIG. 2Q).

At step 236, the excess aluminum is removed, leaving metal only where needed (shown in FIG. 2R).

Step 238 includes formation of terminals in the previously prepared gaps, which will serve as interconnections (shown in FIG. 2S).

Step 240 concludes the process by assigning names to the terminals of the NMOS and PMOS transistors and identifying each connection point (shown in FIG. 2T).

The process of FIG. 2A-2R shows an example of the formation of PMOS transistors and NMOS transistors on the same substrate. However, there are multiple sets of PMOS transistors and NMOS transistors formed on the substrate at the same time, which are then connected in the metallization steps to form the circuits described herein.

Figure 3:
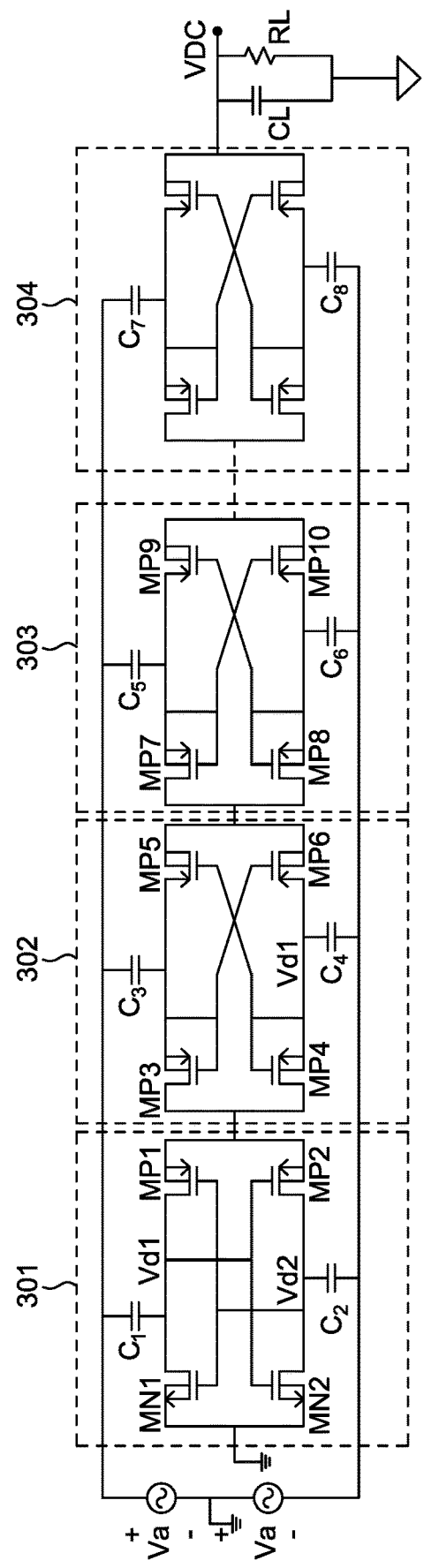
FIG. 3 illustrates a RF-DC converter with cascading of multiple stages, according to certain embodiments.

FIG. 3 illustrates a RF-DC converter 100 with cascading of multiple stages, in accordance with one embodiment. In FIG. 3, four stages of the cross-coupled circuits, that is, the first stage including a first cross-coupled circuit 301, and a second cross-coupled circuit 302, then two additional stages including a third cross-coupled circuit 303 and a fourth cross-coupled circuit 304, are shown. Note that the RC load circuit has been placed at the output of the fourth cross-coupled circuit 304. The additional stages are composed only of PMOS transistors.

In one aspect of the present disclosure, the third cross-coupled circuit 303 is connected to the output terminal of the second cross-coupled circuit 302. The third cross-coupled circuit 303 consists of a seventh PMOS transistor MP7, an eighth PMOS transistor MP8, a ninth PMOS transistor MP9, and a tenth PMOS transistor MP10. Each of the seventh PMOS transistor MP7, the eighth PMOS transistor MP8, the ninth PMOS transistor MP9, and the tenth PMOS transistor MP10 are fabricated on the substrate by the n-well process. In an aspect, the additional stages may be formed on a different substrate and connected after formation to the first stage. In another alternate aspect, the first stage and the additional stages may be formed on the same substrate as completed circuits. For example, the first stage and one additional stage may be formed during the processing as a completed circuit, or the first stage and two additional stages may be formed during the processing as a completed circuit, or the first stage and multiple stages may be formed as a completed circuit on the same substrate.

In an aspect of the present disclosure, the RF-DC converter 100 includes a fifth capacitor C5, and a sixth capacitor C6. The fifth capacitor C5 is connected between the positive output terminal of the balun 124 and a source terminal and a body terminal of the seventh PMOS transistor MP7 and to a source terminal and a body terminal of the ninth PMOS transistor MP9. The sixth capacitor C6 is connected between the negative output terminal of the balun 124 and a source terminal and a body terminal of the seventh PMOS transistor MP7 and to a source terminal and a body terminal of the ninth PMOS transistor MP9. The capacitance values of the capacitors C1-C6 are preferably the same.

The fourth cross-coupled circuit 304 has capacitors referred to as C7 and C8 having capacitance values preferably the same as C1. Otherwise, the fourth cross-coupled circuit 304 is identical to the third cross-coupled circuit 303.

Referring back to FIG. 3, in one aspect, a plurality of series connected cross-coupled circuits (i.e., third cross-coupled circuit 303 and fourth cross-coupled circuit 304) identical to the second cross-coupled circuit 302 may be added between the second cross-coupled circuit 302 and the RC load. For example, a third stage, a fourth stage, a fifth stage and other additional stages identical to the second cross-coupled circuit may be added A last cross-coupled circuit stage has an output terminal connected to an RC load circuit which comprises a load capacitor and a load resistor connected in parallel. The plurality of series connected cross-coupled circuit stages are formed on the substrate by the n-well process.

In another aspect, N additional series connected stages can be implemented. The N additional series connected stages are identical to the second cross-coupled circuit 302. A first stage of the N additional series connected stages is connected to the output terminal of the second stage, wherein N=1, 2, . . . , 10.

An output circuit of the RF-DC converter 100, having the N additional series connected stages, is connected to an output terminal of the last stage of the N additional stages. The output circuit includes a load capacitor $C_L$ and a load resistor $R_L$ connected in parallel. The output voltage, $V_{DC}$, is measured at the output circuit.

Figure 4:
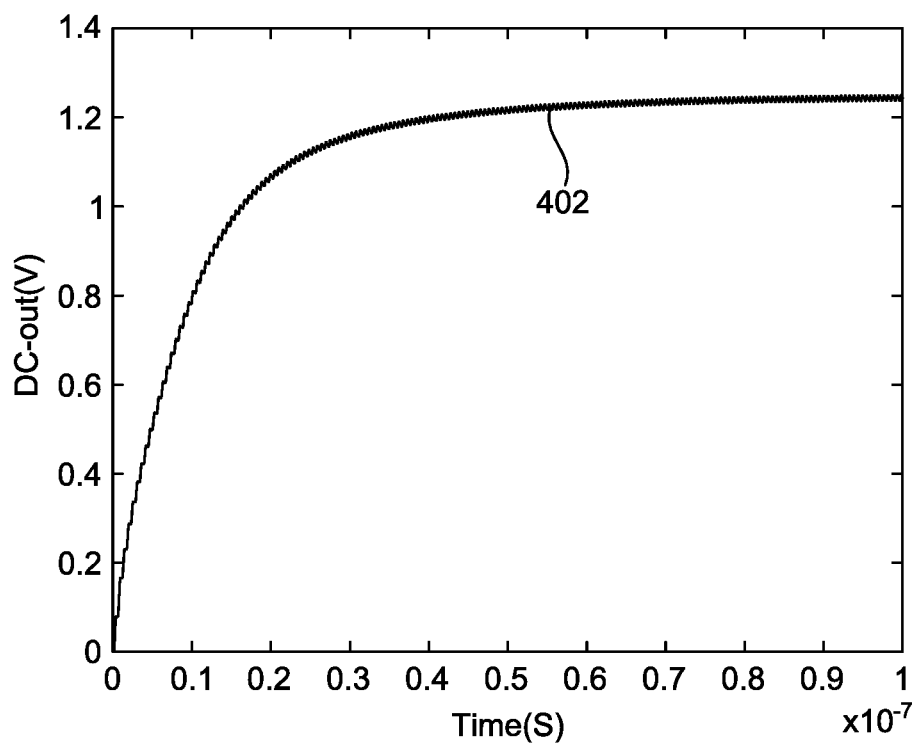
FIG. 4 illustrates the transient response for the first two hybrid stages of the RF-DC converter, according to certain embodiments.

FIG. 4 illustrates the transient response for the first two cross-coupled circuits of the RF-DC converter 100, in accordance with one embodiment. The RF-DC converter 100, as described with reference to FIG. 1A, has been implemented in 0.18 μm TSMC CMOS process technology and assessed within the Cadence Virtuoso software suite. The transistor dimensions for the cross-coupled differential-drive (CCDD) configuration are set uniformly with MN1, MN2, MP1, and MP2 each at a size of 20 μm/0.18 μm. For the subsequent stage, the PMOS transistors PM3 and PM4 are set at 60 μm/0.18 μm, with PM5 and PM6 at 20 μm/0.18 μm. These dimensions are consistently applied to any further stages composed solely of PMOS transistors. The capacitors in the circuit are designated as C1 and C2 with a capacitance of 2 pF each, and the load capacitor $C_L$ also has a capacitance of 2 pF, with the load resistance $R_L$ specified at 100 kΩ. The operational frequency for the signal is established at 920 MHz. The transient response of this dual-stage hybrid system is depicted by curve 402.

Figure 5:
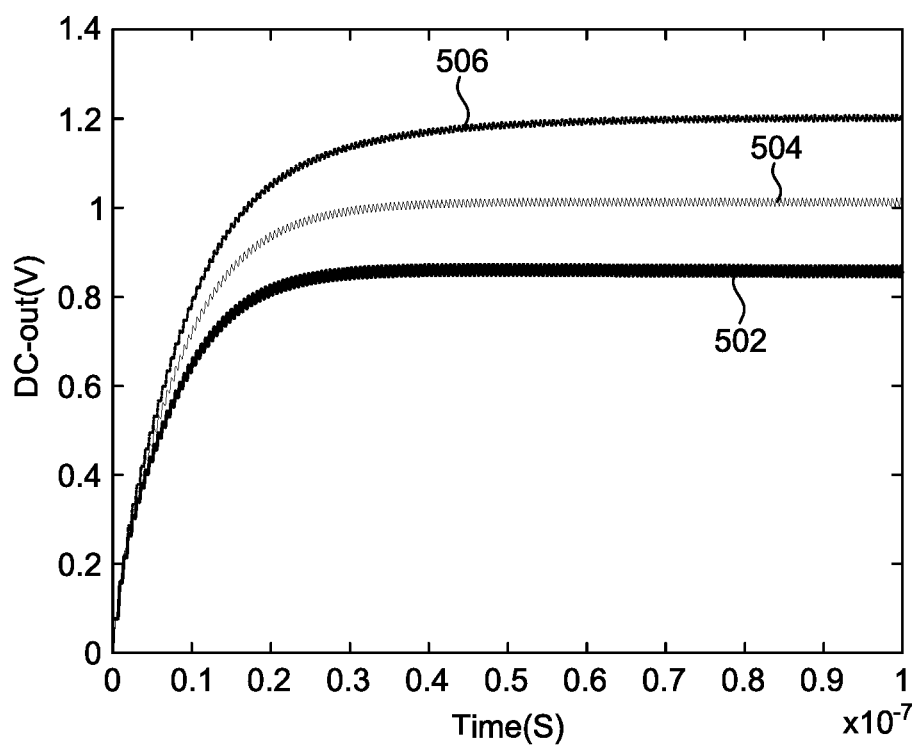
FIG. 5 is a graphical representation of the DC output voltage for different loads, according to certain embodiments.

FIG. 5 is a representation of the DC output voltage for different loads, in accordance with one embodiment.

The dual-hybrid stage was tested using various load resistances, specifically 5 kΩ, 10 kΩ, and 50 kΩ. The resulting DC output voltages for these loads are presented by curve 502 when load resistance is 5 kΩ, curve 504 when load resistance is 10 kΩ, and curve 506 when load resistance is 50 kΩ. FIG. 4 and FIG. 5 indicate that any increase in the load resistance beyond 100 kΩ does not substantially raise the output voltage.

Figure 6:
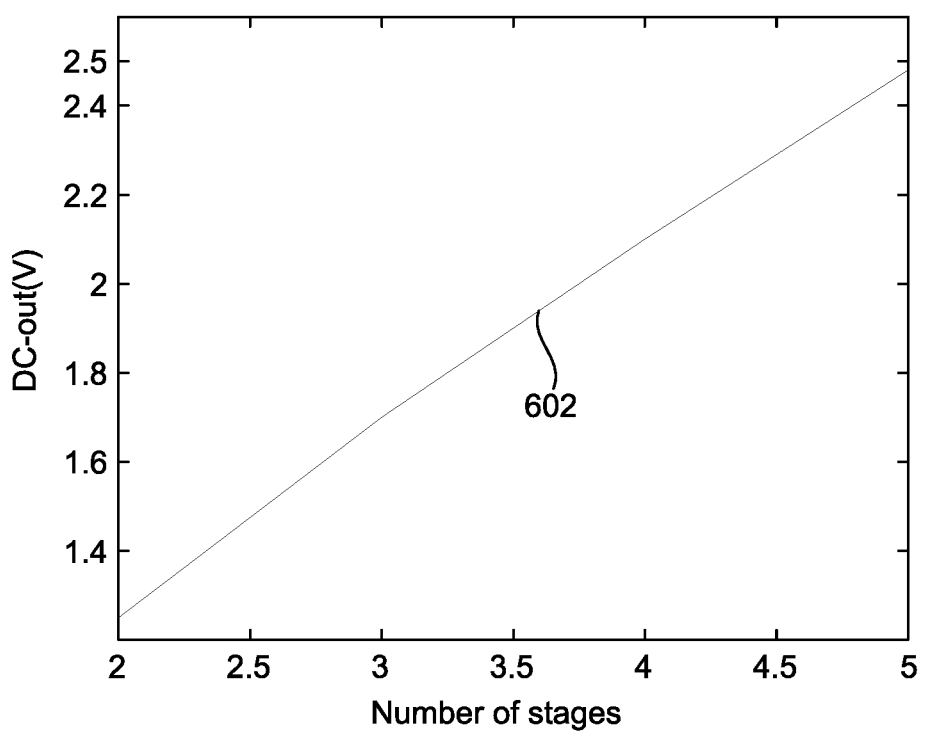
FIG. 6 is a graphical representation of the output voltage as a function of the number of stages, according to certain embodiments.

FIG. 6 is a graphical representation of the output voltage as a function of the number of stages, in accordance with on embodiment. Curve 602 indicates that with increasing number of stages, higher DC output is achieved.

Figure 7:
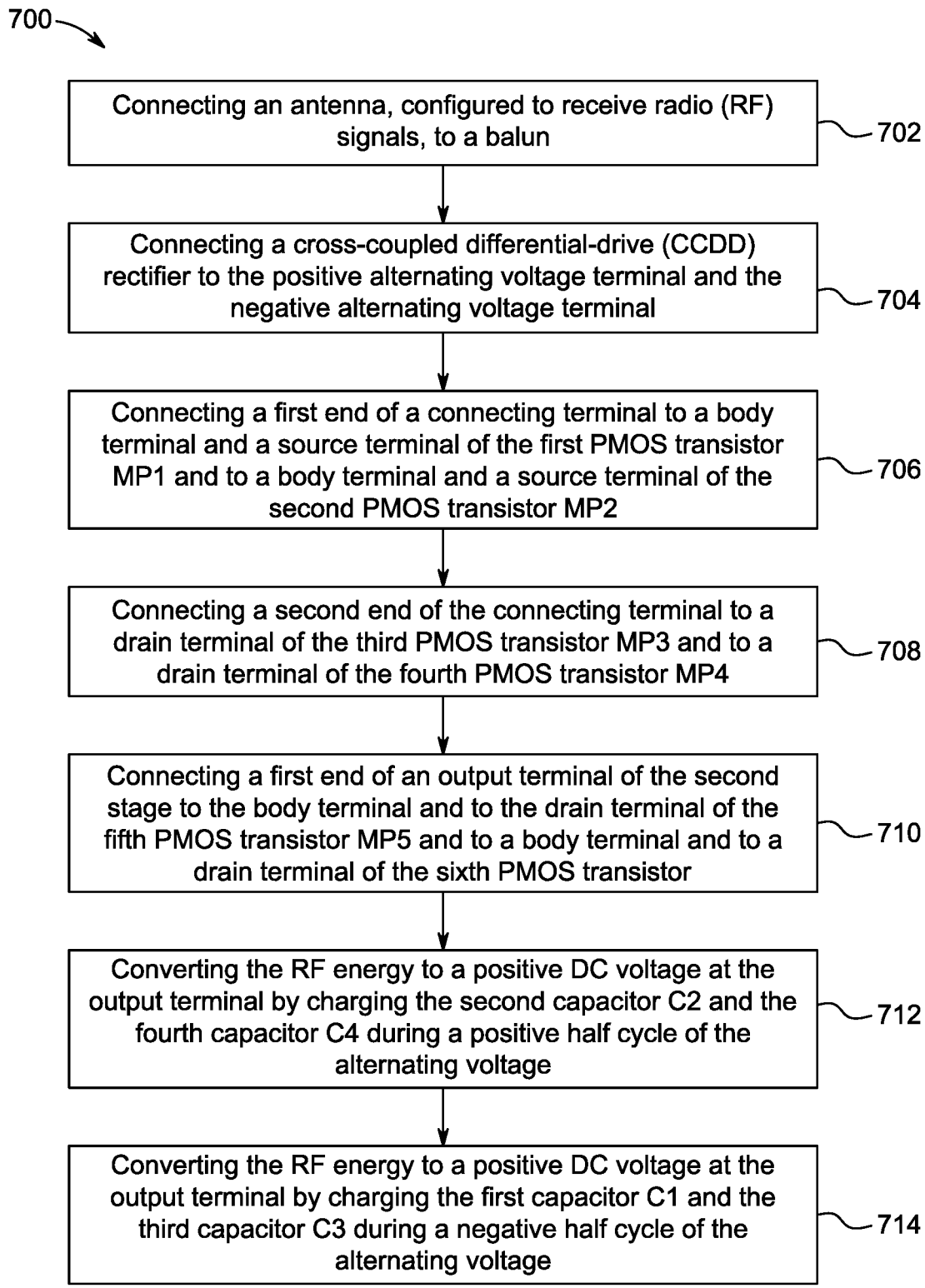
FIG. 7 is a flow chart of a method of harvesting RF energy, according to certain embodiments.

FIG. 7 illustrates a method of harvesting RF energy, in accordance with one embodiment. The method includes connecting an antenna 120, configured to receive radio (RF) signals, to a balun 124, at step 702. The balun 124 is configured to convert the RF signals to a positive alternating voltage at a positive alternating voltage terminal and to a negative alternating voltage at a negative alternating voltage terminal.

At step 704, the method includes connecting the CCDD rectifier 101 to the positive alternating voltage terminal and the negative alternating voltage terminal. The CCDD rectifier 101 includes a series connected first stage and second stage.

The first cross-coupled circuit 110 includes a first NMOS transistor MN1, a first PMOS transistor MP1, a second NMOS transistor MN2, and a second PMOS transistor MP2. Each of the first NMOS transistor MN1, the second NMOS transistor MN2, the first PMOS transistor MP1, and the second PMOS transistor MP2 are fabricated by the n-well process. The first cross-coupled circuit 110 further includes a first capacitor C1 connected to a drain terminal of the first NMOS transistor MN1 and to a drain terminal of the first PMOS transistor MP1, and a second capacitor C2 connected to a drain terminal of the second NMOS transistor MN2 and to a drain terminal of the second PMOS transistor MP2. The first cross-coupled circuit 110 further includes a ground terminal connected to a body terminal and to a source terminal of the first NMOS transistor MN1 and to a body terminal and to a source terminal of the second NMOS transistor MN2. A first cross-coupling connector 102 is connected to a gate of the first NMOS transistor MN1, to a gate of the first PMOS transistor MP1 and to the second capacitor C2.

A second cross-coupling connector 104 is connected to a gate of the second NMOS transistor MN2, to a gate of the second PMOS transistor MP2 and to the first capacitor C1. The second stage includes a third PMOS transistor MP3, a fourth PMOS transistor MP4, a fifth PMOS transistor MP5, and a sixth PMOS transistor. Each of the third PMOS transistor MP3, the fourth PMOS transistor MP4, the fifth PMOS transistor MP5, and the sixth PMOS transistor are fabricated on the substrate by the n-well process. A third capacitor C3 is connected to a source terminal of the third PMOS transistor MP3 and to a source terminal of the fifth PMOS transistor MP5. A fourth capacitor C4 is connected to a source terminal of the fourth PMOS transistor MP4 and to a source terminal of the sixth PMOS transistor. A third cross-coupling connector 106 is connected to a gate of the third PMOS transistor MP3, to a gate of the sixth PMOS transistor and to the third capacitor C3. A fourth cross-coupling connector 108 is connected to a gate of the fourth PMOS transistor MP4, to a gate of the fifth PMOS transistor MP5 and to the fourth capacitor C4.

At step 706, the method further includes connecting a first end of a stage connecting terminal to a body terminal and a source terminal of the first PMOS transistor MP1 and to a body terminal and a source terminal of the second PMOS transistor MP2.

At step 708, the method further includes connecting a second end of the stage connecting terminal to a drain terminal of the third PMOS transistor MP3 and to a drain terminal of the fourth PMOS transistor MP4.

At step 710, the method further includes connecting a first end of an output terminal of the second stage to the body terminal and to the drain terminal of the fifth PMOS transistor MP5 and to a body terminal and to a drain terminal of the sixth PMOS transistor.

At step 712, the method further includes converting the RF energy to a positive DC voltage at the output terminal by charging the second capacitor C2 and the fourth capacitor C4 during a positive half cycle of the alternating voltage.

At step 714, the method further includes converting the RF energy to a positive DC voltage at the output terminal by charging the first capacitor C1 and the third capacitor C3 during a negative half cycle of the alternating voltage.

The first embodiment is illustrated with respect to FIG. 1-FIG. 3. The first embodiment describes a radio frequency to direct current (RF-DC) converter 100. The RF-DC converter 100 includes a first cross-coupled circuit 110, a second cross-coupled circuit 112, and an RF voltage source. The first cross-coupled circuit 110 includes a first NMOS transistor, a first PMOS transistor, a second NMOS transistor and a second PMOS transistor. The second cross-coupled circuit 112 is connected to an output of the first cross-coupled circuit 110. The second cross-coupled circuit 112 includes a third PMOS transistor, a fourth PMOS transistor, a fifth PMOS transistor and a sixth PMOS transistor, each of the third PMOS transistor, the fourth PMOS transistor, the fifth PMOS transistor and the sixth PMOS transistor are fabricated on the substrate by the n-well process. The RF voltage source is connected to the RF-DC converter 100. Each of the first NMOS transistor, the second NMOS transistor, the first PMOS transistor and the second PMOS transistor are fabricated on a substrate by an n-well process.

The first cross-coupled circuit 110 further includes a first capacitor connected to a drain terminal of the first NMOS transistor and to a drain terminal of the first PMOS transistor, a second capacitor connected to a drain terminal of the second NMOS transistor and to a drain terminal of the second PMOS transistor, a ground terminal connected to a body terminal and a source terminal of the first NMOS transistor and to a body terminal and a source terminal of the second NMOS transistor, a first cross-coupling connector 102 connected to a gate of the first NMOS transistor, to a gate of the first PMOS transistor and to the second capacitor, a second cross-coupling connector 104 connected to a gate of the second NMOS transistor, to a gate of the second PMOS transistor and to the first capacitor, and an output terminal of the first cross-coupled circuit 110 connected to a source terminal and a body terminal of the first PMOS transistor and to a source terminal and a body terminal of the second PMOS transistor.

The second cross-coupled circuit 112 includes an input terminal connected to the output terminal of the first cross-coupled circuit 110, wherein the input terminal is connected to a drain terminal of the third PMOS transistor and to a drain terminal of the fourth PMOS transistor, a third capacitor connected to a source terminal and a body terminal of the third PMOS transistor and to a source terminal and a body terminal of the fifth PMOS transistor, a fourth capacitor connected to a source terminal and a body terminal of the fourth PMOS transistor and to a source terminal and a body terminal of the sixth PMOS transistor, a third cross-coupling connector 106 connected to a gate terminal of the third PMOS transistor, to a gate terminal of the sixth PMOS transistor and to the third capacitor, a fourth cross-coupling connector 108 connected to a gate terminal of the fourth PMOS transistor, to a gate of the fifth PMOS transistor and to the fourth capacitor, and an output terminal of the second cross-coupled circuit 112 connected to a body terminal and a source terminal of the fifth PMOS transistor and to a body terminal and a source terminal of the sixth PMOS transistor.

In one aspect, the RF-DC converter 100 includes a balun 124 connected to an RF voltage source, a positive output terminal of the balun 124 is connected to the first capacitor and the third capacitor, and a negative output terminal of the balun 124 is connected to the second capacitor and the fourth capacitor.

In one aspect, in the CCDD rectifier 101, the first capacitor, the second capacitor, the third capacitor and the fourth capacitor are of equal capacitance.

In one aspect, the RF-DC converter 100 includes an RC load circuit connected to the output terminal of the second cross-coupled circuit 112. The RC load circuit includes a load capacitor and a load resistor connected in parallel.

The RF voltage source includes an antenna 120 configured to harvest RF energy from a surrounding environment, and an impedance matching circuit 122 connected to the antenna 120, the impedance matching circuit 122 is configured to match an impedance of the RF energy of the surrounding environment to an impedance of the antenna 120, the antenna 120 is connected to an input terminal of the balun 124.

In one aspect, the RF-DC converter 100 includes a third cross-coupled circuit 303 connected to the output terminal of the second cross-coupled circuit 112, the third cross-coupled circuit 303 including a seventh PMOS transistor, an eighth PMOS transistor, a ninth PMOS transistor and a tenth PMOS transistor, wherein each of the seventh PMOS transistor, the eighth PMOS transistor, the ninth PMOS transistor and the tenth PMOS transistor are fabricated on the substrate by the n-well process, a fifth capacitor connected between the positive output terminal of the balun 124 and a source terminal and a body terminal of the seventh PMOS transistor and to a source terminal and a body terminal of the ninth PMOS transistor, and a sixth capacitor connected between the negative output terminal of the balun 124 and a source terminal and a body terminal of the seventh PMOS transistor and to a source terminal and a body terminal of the ninth PMOS transistor.

In one aspect, the RF-DC converter 100 includes a plurality of series connected cross-coupled circuit stages identical to the second cross-coupled circuit 112, wherein a first of the plurality of series connected cross-coupled stages is connected to the output terminal of the second cross-coupled circuit, wherein a last cross-coupled circuit stage has an output terminal connected to an RC load circuit which comprises a load capacitor and a load resistor connected in parallel, wherein the plurality of series connected cross-coupled circuit stages are formed on the substrate by the n-well process.

The second embodiment is illustrated with respect to FIG. 1-FIG. 3. The second embodiment describes an RF-DC converter 100. The RF-DC converter 100 includes an antenna 120 configured to receive radio frequency (RF) signals, a cross-coupled differential-drive (CCDD) rectifier 101 connected to the antenna 120, the CCDD rectifier 101 includes a series connected first cross-coupled circuit and second cross-coupled circuit, the first cross-coupled circuit includes a first NMOS transistor, a first PMOS transistor, a second NMOS transistor and a second PMOS transistor, each of the first NMOS transistor, the second NMOS transistor, the first PMOS transistor and the second PMOS transistor are fabricated by an n-well process, a first capacitor connected to a drain terminal of the first NMOS transistor and to a drain terminal of the first PMOS transistor, a second capacitor connected to a drain terminal of the second NMOS transistor and to a drain terminal of the second PMOS transistor, a ground terminal connected to a body terminal and to a source terminal of the first NMOS transistor and to a body terminal and to a source terminal of the second NMOS transistor, a first cross-coupling connector 102 connected to a gate of the first NMOS transistor, to a gate of the first PMOS transistor and to the second capacitor, a second cross-coupling connector 104 connected to a gate of the second NMOS transistor, to a gate of the second PMOS transistor and to the first capacitor, the second cross-coupled circuit includes a third PMOS transistor, a fourth PMOS transistor, a fifth PMOS transistor and a sixth PMOS transistor, each of the third PMOS transistor, the fourth PMOS transistor, the fifth PMOS transistor and the sixth PMOS transistor are fabricated on the substrate by the n-well process, a third capacitor connected to a source terminal of the third PMOS transistor and to a source terminal of the fifth PMOS transistor, a fourth capacitor connected to a source terminal of the second PMOS transistor and to a source terminal of the sixth PMOS transistor, a connecting terminal configured to connect a body terminal and a source terminal of the first PMOS transistor and a body terminal and a source terminal of the second PMOS transistor to a body terminal and a drain terminal of the third PMOS transistor and to a body terminal and a drain terminal of the fourth PMOS transistor, a third cross-coupling connector 106 connected to a gate of the third PMOS transistor, to a gate of the sixth PMOS transistor and to the third capacitor, and a fourth cross-coupling connector 108 connected to a gate of the fourth PMOS transistor, to a gate of the fifth PMOS transistor and to the third capacitor.

In one aspect, the RF-DC converter 100 includes an output circuit including a load capacitor and a load resistor connected in parallel, the output circuit is connected at a first end to a source terminal and a body terminal of the fifth PMOS transistor and to a source terminal and a body terminal of the sixth PMOS transistor, and at a second end to the ground terminal.

In one aspect, the RF-DC converter 100 includes a balun 124 connected to the antenna 120, the balun 124 is configured to convert the RF signals received at the antenna 120 to a positive alternating voltage at a positive alternating voltage terminal and to a negative alternating voltage at a negative alternating voltage terminal, the positive alternating voltage terminal is connected to the first capacitor and the third capacitor, and the negative alternating voltage terminal is connected to the second capacitor and the fourth capacitor.

In one aspect, the first capacitor, the second capacitor, the third capacitor and the fourth capacitor are of equal capacitance.

In one aspect, the RF-DC converter 100 includes an output terminal of the second cross-coupled circuit connected at a first end to the source terminal of the fifth PMOS transistor and to the source terminal and the body terminal of the sixth PMOS transistor, and at a second end to the ground terminal.

In one aspect, the RF-DC converter 100 includes N additional series connected stages identical to the second cross-coupled circuit, a first stage of the N additional series connected stage stages is connected to the output terminal of the second stage, N=1, 2, . . . , 10, and an output circuit connected to an output terminal of a last stage of the N additional stages, the output circuit includes a load capacitor and a load resistor connected in parallel.

In one aspect, the first capacitor, the second capacitor, the third capacitor and the fourth capacitor and each capacitor of the N additional stages are of equal capacitance.

The third embodiment is illustrated with respect to FIG. 1-FIG. 7. The third embodiment describes a method of harvesting RF energy. The method includes connecting an antenna 120 configured to receive radio (RF) signals to a balun 124, the balun 124 is configured to convert the RF signals to a positive alternating voltage at a positive alternating voltage terminal and to a negative alternating voltage at a negative alternating voltage terminal, connecting a cross-coupled differential-drive (CCDD) rectifier 101 to the positive alternating voltage terminal and the negative alternating voltage terminal, the CCDD rectifier 101 includes a series connected first cross-coupled circuit and second cross-coupled circuit, the first cross-coupled circuit includes a first NMOS transistor, a first PMOS transistor, a second NMOS transistor and a second PMOS transistor, each of the first NMOS transistor, the second NMOS transistor, the first PMOS transistor and the second PMOS transistor are fabricated by an n-well process, a first capacitor connected to a drain terminal of the first NMOS transistor and to a drain terminal of the first PMOS transistor, a second capacitor connected to a drain terminal of the second NMOS transistor and to a drain terminal of the second PMOS transistor, a ground terminal connected to a body terminal and to a source terminal of the first NMOS transistor and to a body terminal and to a source terminal of the second NMOS transistor, a first cross-coupling connector 102 connected to a gate of the first NMOS transistor, to a gate of the first PMOS transistor and to the second capacitor, a second cross-coupling connector 104 connected to a gate of the second NMOS transistor, to a gate of the second PMOS transistor and to the first capacitor, the second cross-coupled circuit includes a third PMOS transistor, a fourth PMOS transistor, a fifth PMOS transistor and a sixth PMOS transistor, each of the third PMOS transistor, the fourth PMOS transistor, the fifth PMOS transistor and the sixth PMOS transistor are fabricated on the substrate by the n-well process, a third capacitor connected to a source terminal of the third PMOS transistor and to a source terminal of the fifth PMOS transistor, a fourth capacitor connected to a source terminal of the fourth PMOS transistor and to a source terminal of the sixth PMOS transistor, a third cross-coupling connector 106 connected to a gate of the third PMOS transistor, to a gate of the sixth PMOS transistor and to the third capacitor, and a fourth cross-coupling connector 108 connected to a gate of the fourth PMOS transistor, to a gate of the fifth PMOS transistor and to the fourth capacitor, connecting a first end of a connecting terminal to a body terminal and a source terminal of the first PMOS transistor and to a body terminal and a source terminal of the second PMOS transistor, connecting a second end of the connecting terminal to a drain terminal of the third PMOS transistor and to a drain terminal of the fourth PMOS transistor, connecting a first end of an output terminal of the second cross-coupled circuit to the body terminal and to the drain terminal of the fifth PMOS transistor and to a body terminal and to a drain terminal of the sixth PMOS transistor, converting the RF energy to a positive DC voltage at the output terminal by charging the second capacitor and the fourth capacitor during a positive half cycle of the alternating voltage, and converting the RF energy to a positive DC voltage at the output terminal by charging the first capacitor and the third capacitor during a negative half cycle of the alternating voltage.

In one aspect, the method includes connecting a second end of the output terminal of the second cross-coupled circuit to an output circuit including a load capacitor and a load resistor connected in parallel.

In one aspect, the method includes connecting the output terminal of the second cross-coupled circuit to an input terminal of a first stage of N additional series connected stages, wherein each of the N additional series connecting stages is identical to the second cross-coupled circuit, wherein N=1, 2, . . . , 10, and connecting an output circuit to an output terminal of a last stage of the N additional stages, wherein the output circuit includes a load capacitor and a load resistor connected in parallel.

In one aspect, the method includes connecting an impedance matching circuit 122 to the antenna 120, wherein the impedance matching circuit 122 is configured to match an impedance of the RF energy of the surrounding environment to an impedance of the antenna 120, wherein the antenna 120 is connected to an input terminal of the balun 124.

Numerous modifications and variations of the present disclosure are possible in light of the above teachings. It is therefore to be understood that within the scope of the appended claims, the invention may be practiced otherwise than as specifically described herein.

The invention claimed is:

1. A radio frequency to direct current (RF-DC) converter, comprising:
   a first cross-coupled circuit including:
   a first NMOS transistor, a first PMOS transistor, a second NMOS transistor and a second PMOS transistor, wherein each of the first NMOS transistor, the second NMOS transistor, the first PMOS transistor and the second PMOS transistor are formed on a substrate by an n-well process; and
   a second cross-coupled circuit connected to an output of the first cross-coupled circuit, the second cross-coupled circuit including:
   a third PMOS transistor, a fourth PMOS transistor, a fifth PMOS transistor and a sixth PMOS transistor, wherein each of the third PMOS transistor, the fourth PMOS transistor, the fifth PMOS transistor and the sixth PMOS transistor are formed on the substrate by the n-well process; and
   an RF voltage source connected to the RF-DC converter, wherein the first cross-coupled circuit further comprises:
      a first capacitor connected to a drain terminal of the first NMOS transistor and to a drain terminal of the first PMOS transistor;
      a second capacitor connected to a drain terminal of the second NMOS transistor and to a drain terminal of the second PMOS transistor;
      a ground terminal connected to a body terminal and a source terminal of the first NMOS transistor and to a body terminal and a source terminal of the second NMOS transistor;
      a first cross-coupling connector connected to a gate of the first NMOS transistor, to a gate of the first PMOS transistor and to the second capacitor;
      a second cross-coupling connector connected to a gate of the second NMOS transistor, to a gate of the second PMOS transistor and to the first capacitor; and
      an output terminal of the first cross-coupled circuit connected to a source terminal and a body terminal of the first PMOS transistor and to a source terminal and a body terminal of the second PMOS transistor; and
   wherein the second cross-coupled circuit further comprises:
      an input terminal connected to the output terminal of the first cross-coupled circuit, wherein the input terminal is connected to a drain terminal of the third PMOS transistor and to a drain terminal of the fourth PMOS transistor;
      a third capacitor connected to a source terminal and a body terminal of the third PMOS transistor and to a source terminal and a body terminal of the fifth PMOS transistor;
      a fourth capacitor connected to a source terminal and a body terminal of the fourth PMOS transistor and to a source terminal and a body terminal of the sixth PMOS transistor;
      a third cross-coupling connector connected to a gate terminal of the third PMOS transistor, to a gate terminal of the sixth PMOS transistor and to the third capacitor;
      a fourth cross-coupling connector connected to a gate terminal of the fourth PMOS transistor, to a gate of the fifth PMOS transistor and to the fourth capacitor; and
      an output terminal of the second cross-coupled circuit connected to a body terminal and a source terminal of the fifth PMOS transistor and to a body terminal and a source terminal of the sixth PMOS transistor.

2. The RF-DC converter of claim 1, further comprising:
   a balun connected to an RF voltage source, wherein a positive output terminal of the balun is connected to the first capacitor and the third capacitor, and a negative output terminal of the balun is connected to the second capacitor and the fourth capacitor.

3. The CCDD rectifier of claim 2, wherein the first capacitor, the second capacitor, the third capacitor and the fourth capacitor are of equal capacitance.

4. The RF-DC converter of claim 2, further comprising:
   an RC load circuit connected to the output terminal of the second cross-coupled circuit, wherein the RC load circuit comprises a load capacitor and a load resistor connected in parallel.

5. The RF-DC converter of claim 4, wherein the RF voltage source comprises:
   an antenna configured to harvest RF energy from a surrounding environment;
   an impedance matching circuit connected to the antenna, wherein the impedance matching circuit is configured to match an impedance of the RF energy of the surrounding environment to an impedance of the antenna, wherein the antenna is connected to an input terminal of the balun.

6. The RF-DC converter of claim 2, further comprising:
   a third cross-coupled circuit connected to the output terminal of the second cross-coupled circuit, the third cross-coupled circuit including a seventh PMOS transistor, an eighth PMOS transistor, a ninth PMOS transistor and a tenth PMOS transistor, wherein each of the seventh PMOS transistor, the eighth PMOS transistor, the ninth PMOS transistor and the tenth PMOS transistor are formed on the substrate by the n-well process;
   a fifth capacitor connected between the positive output terminal of the balun and a source terminal and a body terminal of the seventh PMOS transistor and to a source terminal and a body terminal of the ninth PMOS transistor; and a sixth capacitor connected between the negative output terminal of the balun and a source terminal and a body terminal of the seventh PMOS transistor and to a source terminal and a body terminal of the ninth PMOS transistor.

7. The RF-DC converter of claim 2, further comprising:

a plurality of series connected cross-coupled circuit stages identical to the second cross-coupled circuit, wherein a first of the plurality of series connected cross-coupled stages is connected to the output terminal of the second cross-coupled circuit, wherein a last cross-coupled circuit stage has an output terminal connected to an RC load circuit which comprises a load capacitor and a load resistor connected in parallel, wherein the plurality of series connected cross-coupled circuit stages are formed on the substrate by the n-well process.

8. A radio frequency to direct current (RF-DC) converter, comprising:

an antenna configured to receive radio frequency (RF) signals;

a cross-coupled differential-drive (CCDD) rectifier connected to the antenna, wherein the CCDD rectifier includes a series connected first cross-coupled circuit and second cross-coupled circuit, wherein the first cross-coupled circuit includes:

a first NMOS transistor, a first PMOS transistor, a second NMOS transistor and a second PMOS transistor, wherein each of the first NMOS transistor, the second NMOS transistor, the first PMOS transistor and the second PMOS transistor are fabricated by an n-well process;

a first capacitor connected to a drain terminal of the first NMOS transistor and to a drain terminal of the first PMOS transistor;

a second capacitor connected to a drain terminal of the second NMOS transistor and to a drain terminal of the second PMOS transistor;

a ground terminal connected to a body terminal and to a source terminal of the first NMOS transistor and to a body terminal and to a source terminal of the second NMOS transistor;

a first cross-coupling connector connected to a gate of the first NMOS transistor, to a gate of the first PMOS transistor and to the second capacitor;

a second cross-coupling connector connected to a gate of the second NMOS transistor, to a gate of the second PMOS transistor and to the first capacitor;

wherein the second cross-coupled circuit includes:

a third PMOS transistor, a fourth PMOS transistor, a fifth PMOS transistor and a sixth PMOS transistor, wherein each of the third PMOS transistor, the fourth PMOS transistor, the fifth PMOS transistor and the sixth PMOS transistor are fabricated on the substrate by the n-well process;

a third capacitor connected to a source terminal of the third PMOS transistor and to a source terminal of the fifth PMOS transistor;

a fourth capacitor connected to a source terminal of the second PMOS transistor and to a source terminal of the sixth PMOS transistor;

a connecting terminal configured to connect a body terminal and a source terminal of the first PMOS transistor and a body terminal and a source terminal of the second PMOS transistor to a body terminal and a drain terminal of the third PMOS transistor and to a body terminal and a drain terminal of the fourth PMOS transistor;

a third cross-coupling connector connected to a gate of the third PMOS transistor, to a gate of the sixth PMOS transistor and to the third capacitor; and a fourth cross-coupling connector connected to a gate of the fourth PMOS transistor, to a gate of the fifth PMOS transistor and to the third capacitor.

9. The RF-DC converter of claim 8, further comprising:

an output circuit including a load capacitor and a load resistor connected in parallel, wherein the output circuit is connected at a first end to a source terminal and a body terminal of the fifth PMOS transistor and to a source terminal and a body terminal of the sixth PMOS transistor, and at a second end to the ground terminal.

10. The RF-DC converter of claim 8, further comprising:

a balun connected to the antenna, wherein the balun is configured to convert the RF signals received at the antenna to a positive alternating voltage at a positive alternating voltage terminal and to a negative alternating voltage at a negative alternating voltage terminal, wherein the positive alternating voltage terminal is connected to the first capacitor and the third capacitor, and the negative alternating voltage terminal is connected to the second capacitor and the fourth capacitor.

11. The RF-DC converter of claim 8, wherein the first capacitor, the second capacitor, the third capacitor and the fourth capacitor are of equal capacitance.

12. The RF-DC converter of claim 8, further comprising:

an output terminal of the second cross-coupled circuit connected at a first end to the source terminal of the fifth PMOS transistor and to the source terminal and the body terminal of the sixth PMOS transistor, and at a second end to the ground terminal.

13. The RF-DC converter of claim 12, further comprising:

N additional series connected stages identical to the second cross-coupled circuit, wherein a first stage of the N additional series connected stage stages is connected to the output terminal of the second stage, wherein N=1, 2, . . . , 10; and an output circuit connected to an output terminal of a last stage of the N additional stages, wherein the output circuit includes a load capacitor and a load resistor connected in parallel.

14. The RF-DC converter of claim 13, wherein the first capacitor, the second capacitor, the third capacitor and the fourth capacitor and each capacitor of the N additional stages are of equal capacitance.

* * * * *